US010205436B2

(12) United States Patent
Scott et al.

(10) Patent No.: US 10,205,436 B2
(45) Date of Patent: Feb. 12, 2019

(54) HIGH-VOLTAGE CONVERTER BASED TUNING OF ACOUSTIC FILTERS

(71) Applicant: Qorvo US, Inc., Greensboro, NC (US)

(72) Inventors: Baker Scott, San Jose, CA (US);
Robert Aigner, Ocoee, FL (US);
Gernot Fattinger, Sorrento, FL (US);
George Maxim, Saratoga, CA (US);
Dirk Robert Walter Leipold, San Jose, CA (US); Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 180 days.

(21) Appl. No.: 15/338,544

(22) Filed: Oct. 31, 2016

(65) Prior Publication Data

US 2018/0097507 A1    Apr. 5, 2018

Related U.S. Application Data

(60) Provisional application No. 62/401,991, filed on Sep. 30, 2016.

(51) Int. Cl.
*H03H 9/54*    (2006.01)
*H03H 9/64*    (2006.01)
(Continued)

(52) U.S. Cl.
CPC ............. *H03H 9/542* (2013.01); *G05F 1/46* (2013.01); *H03H 9/6403* (2013.01); *H03H 2009/02188* (2013.01)

(58) Field of Classification Search
CPC ......... H03H 2009/02196; H03H 9/605; H03H 9/54; H03H 2009/02188; H03H 9/6403; H03H 9/542; G05F 1/46
(Continued)

(56) References Cited

U.S. PATENT DOCUMENTS 5,446,306 A * 8/1995 Stokes ............... H03H 9/02102
                                                    257/416
7,098,575 B2 * 8/2006 Mehta .................... H03H 9/174
                                                    310/320
(Continued)

OTHER PUBLICATIONS

Aigner, Robert, "Tunable Acoustic RF-Filters: Discussion of Requirements and Potential Physical Embodiments," Proceedings of the 40th European Microwave Conference, Sep. 28-30, 2010, Paris, France, EuMA, pp. 787-790.

*Primary Examiner* — Rakesh Patel
*Assistant Examiner* — Jorge Salazar, Jr
(74) *Attorney, Agent, or Firm* — Withrow & Terranova, P.L.L.C.

(57) ABSTRACT

Embodiments of an acoustic wave filter system that includes at least one acoustic wave filter and acoustic wave tuning control circuitry are disclosed. The acoustic wave filter includes at least one acoustic wave resonator and defines a passband. To provide tuning for calibration or for dynamic filter operation, the acoustic wave tuning control circuitry is configured to bias one or more of the acoustic wave resonators with bias voltages. Biasing an acoustic wave resonator affects the resonances of the resonator, thereby allowing for the passband of the acoustic wave resonator to be tuned. Accordingly, the acoustic wave tuning control circuitry is configured to adjust the bias voltages so that the acoustic wave filter shifts the passband. In this manner, the passband of the acoustic wave filter can be tuned with high degree of accuracy and without requiring physical alterations to the acoustic wave resonators.

18 Claims, 13 Drawing Sheets

(51) Int. Cl.
*G05F 1/46* (2006.01)
*H03H 9/02* (2006.01)
(58) Field of Classification Search
USPC .......................................... 333/187, 188, 189
See application file for complete search history.

(56) References Cited

U.S. PATENT DOCUMENTS

| | | | | |
|---|---|---|---|---|
| 2006/0001329 A1* | 1/2006 | Rao | .................... | H03H 9/02102 |
| | | | | 310/315 |
| 2007/0210879 A1* | 9/2007 | Cardona | ................ | H03H 9/172 |
| | | | | 333/188 |

* cited by examiner

HIGH-VOLTAGE CONVERTER BASED TUNING OF ACOUSTIC FILTERS

RELATED APPLICATIONS

This application claims the benefit of provisional patent application Ser. No. 62/401,991, filed Sep. 30, 2016, the disclosure of which is hereby incorporated herein by reference in its entireties.

FIELD OF THE DISCLOSURE

This disclosure relates generally to acoustic wave filtering systems and methods of operating the same.

BACKGROUND

Many modern radio frequency (RF) communication standards and specifications (in particular, RF communication standards and specifications involving carrier aggregation (CA)) involve RF communication bands for RF signals that span relatively large and high frequency ranges (often over 1.5 GHz). For example, these RF communication bands may span large frequency ranges because various channels of operation are defined within the RF communication band. Typically these RF communication bands are referred to as widebands. To operate in accordance with RF communication standards and specifications for these widebands, RF communication circuitry requires RF filters capable of providing passbands that maintain high passband integrity at these high frequencies through the entire frequency range of the wideband. Furthermore, the frequency separation between these widebands is often small. For example, a frequency range of the RF communication band B66 goes up to 2.2 GHz while a frequency range of the RF communication band B40 goes down to 2.3 GHz thereby resulting in a frequency separation of just 100 MHz between the RF communication band B40, B66. Thus, not only do these widebands require RF filters with passbands that do not introduce significant insertion losses throughout the entirety of these very high and very large frequency ranges, wide band RF communication standards and specifications also require that the passbands provide sharp roll off at the edges of the passband in order to reject noisy RF signals in very close adjacent RF communication bands. but spanning the entire wideband without introducing significant losses a insertions losses in These RF communication bands are typically referred to a widebands and may define various channels of operation within the RF communication band combinations involve at least one wide-frequency band. An acoustic filter with a wide bandwidth needs a high coupling coefficient and thus results in large flyback out of band and thus is hard to use for CA applications (due to insufficient rejection in the close band).

Traditional RF filters use networks of inductors and capacitive elements that define passbands to cover RF communication bands and stopbands to reject out of band noise. Unfortunately, traditional RF filters are not capable of providing passbands that maintain band integrity throughout the span of the frequency due to their quality (Q) factor limitations and are not capable of simultaneously providing the roll-off required for out-of-band rejection to filter out of can achieve a wide bandwidth (use large coupling coefficients) without giving significant flyback, which is advantageous for CA applications. However, LC filters have limited resonator quality factor, Q, of around a few hundreds, and thus cannot achieve a fast roll-off such as the roll-off needed to multiplex closely spaced frequency bands such as B66-B40 that are 100 MHz apart).

Instead, modern RF technology instead typically employs acoustic wave filters. Acoustic wave filters are often formed by a network of acoustic wave resonators. Acoustic wave filters are capable of providing passbands with much better band integrity throughout the span of the wideband. In particular, bulk acoustic wave resonators (BARs) are often employed to form acoustic wave filters that provide passbands that maintain band integrity thought the span of widebands with frequency ranges above 1.5 GHz. To reject noise from adjacent widebands, the acoustic wave resonators in the acoustic wave filter are arranged so that a stopband is defined from roll off from a band edge of the passband. In this manner, the stopband is defined adjacent to the passband to provide out of band rejection. However, in order for these acoustic wave filters to provide passbands that can maintain integrity throughout the passband, the acoustic wave resonators of the acoustic wave filter need to have high coupling coefficients. The high coupling coefficients between the acoustic wave resonators unfortunately result in the stopbands having high flyback. Often, this high flyback prevents the stopband from providing adequate out of band rejection. Furthermore, fabrication variations and changes in filter behavior due to operating conditions (e.g., variation in filter behavior due to the operating temperature) often result in misalignments that can result in unnecessary insertion losses within the passband or inadequate out of band rejection by the stopband.

Currently, hard tuning techniques, such as mechanically trimming the layers associated with the bulk acoustic wave resonators, are employed to calibrate the acoustic wave filter and prevent these misalignments. However, not only do mechanical trimming techniques permanently alter the acoustic wave resonators, but they often require acoustic wave resonator topologies which are spatially inefficient due to the need to maintain access to the trimmable features of the acoustic wave resonators. Furthermore, it is difficult to employ these mechanical trimming techniques with the accuracy needed to prevent or correct misalignments at the edges of the passbands when the frequency displacement of the wideband and adjacent RF communication bands is so small.

SUMMARY

This disclosure relates generally to acoustic wave filtering systems and methods of operating the same. In one embodiment, an acoustic wave filter system includes at least one acoustic wave filter and acoustic wave tuning control circuitry. The acoustic wave filter includes at least one acoustic wave resonator and defines a passband or a stopband. To provide tuning for calibration or for dynamic filter operation, the acoustic wave tuning control circuitry is configured to bias one or more of the acoustic wave resonators with bias voltages. Biasing an acoustic wave resonator affects the resonances of the resonator thereby allowing for the passband of the acoustic wave resonator to be tuned. Accordingly, the acoustic wave tuning control circuitry is configured to adjust the bias voltages so that the acoustic wave filter shifts the passband. In this manner, the passband of the acoustic wave filter can be tuned with high degree of accuracy and without requiring physical alterations to the acoustic wave resonators.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
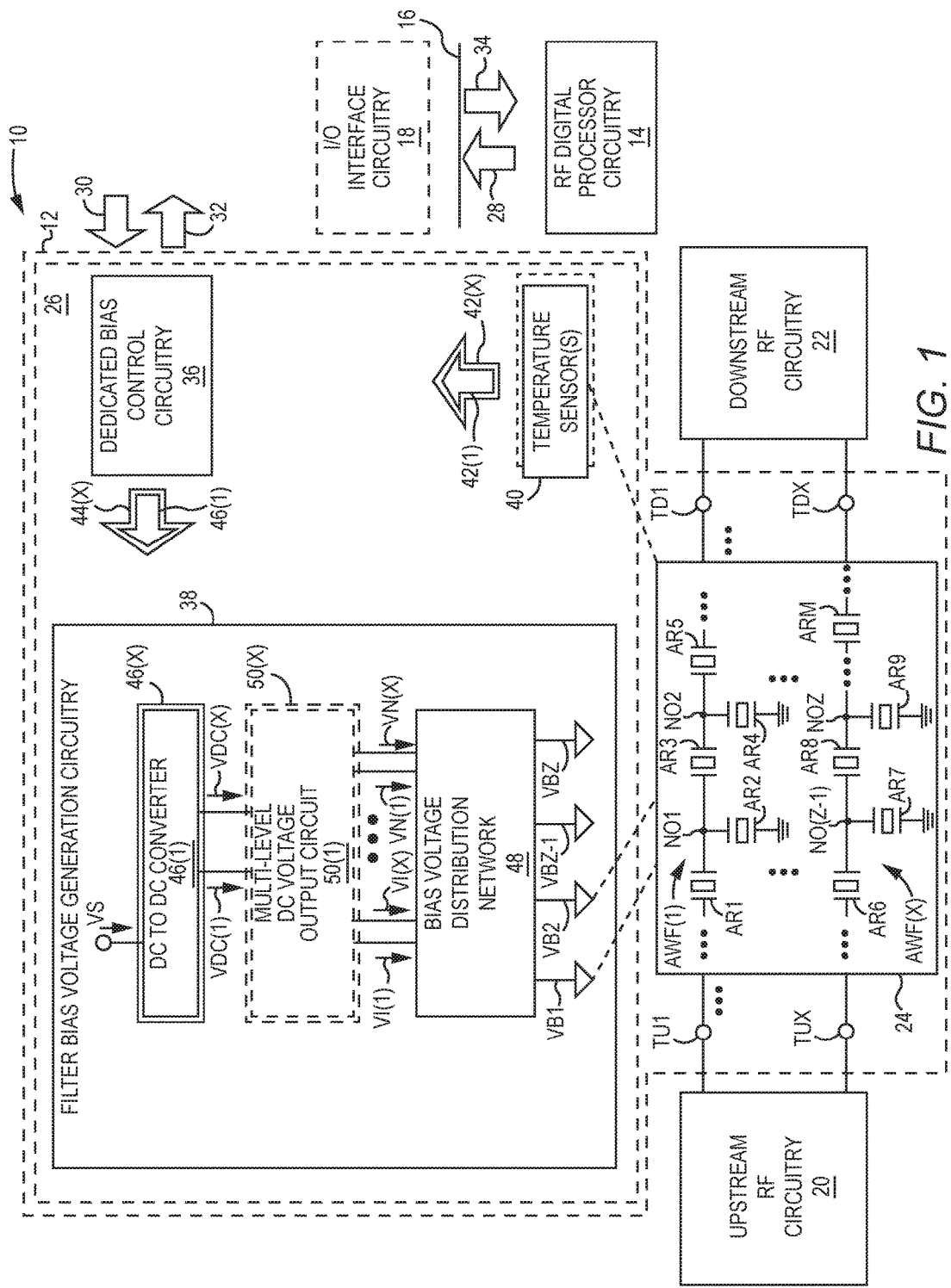
FIG. 1 illustrates one embodiment of RF front-end circuitry that includes an exemplary acoustic wave filtering system having an acoustic wave filtering structure and acoustic wave tuning control circuitry that biases acoustic wave resonators within acoustic wave filters of the acoustic wave filtering structure in order to tune passbands provided by the acoustic wave filters.
Figure 5:
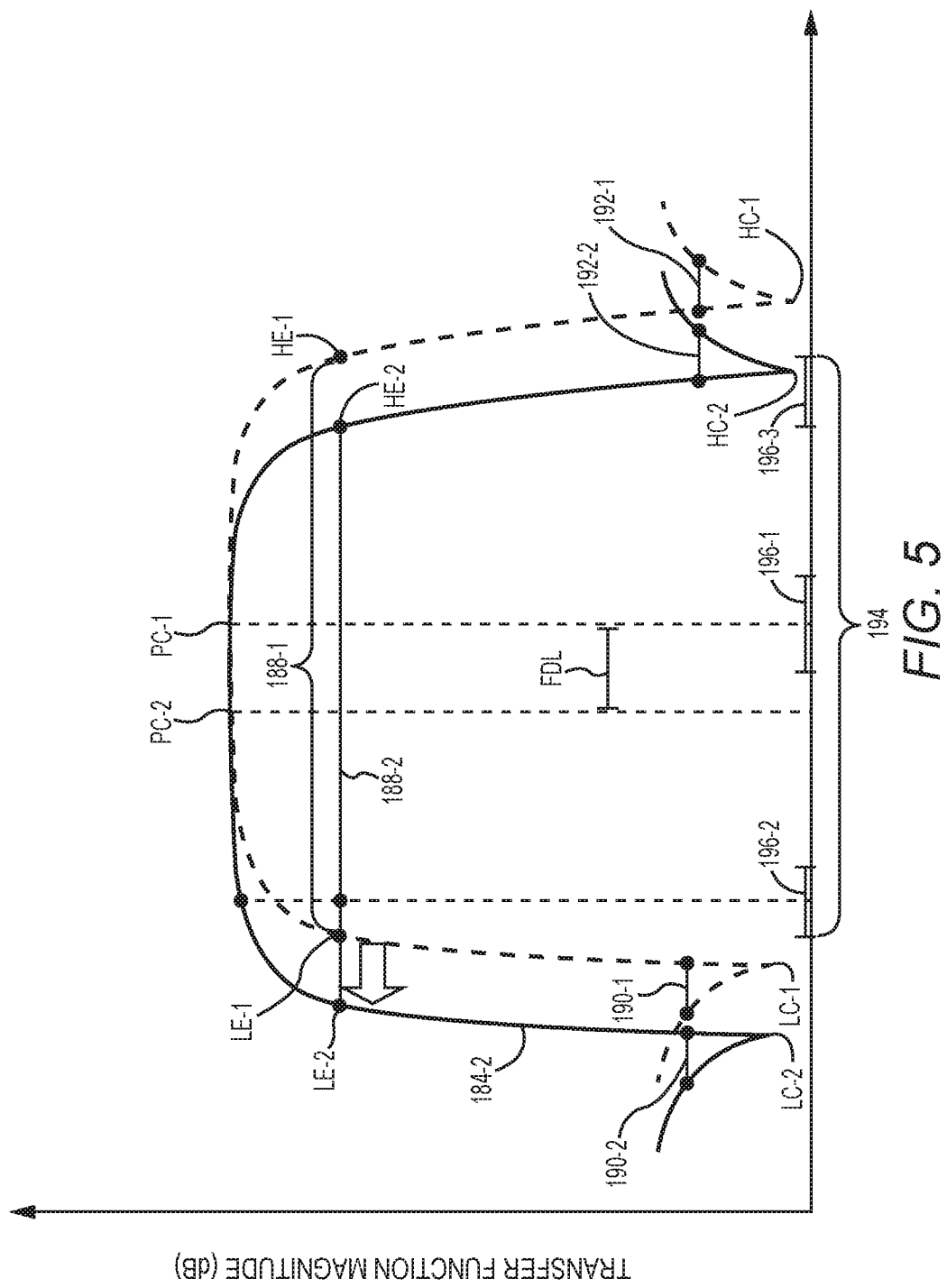

FIG. 5 demonstrates the shifting of the passband of one of the acoustic wave filters shown in FIG. 1 so that the passband is shifted so that the center frequency of the passband is moved towards the selected channel and a low frequency edge of the passband is moved away from the selected channel.

Figure 6:
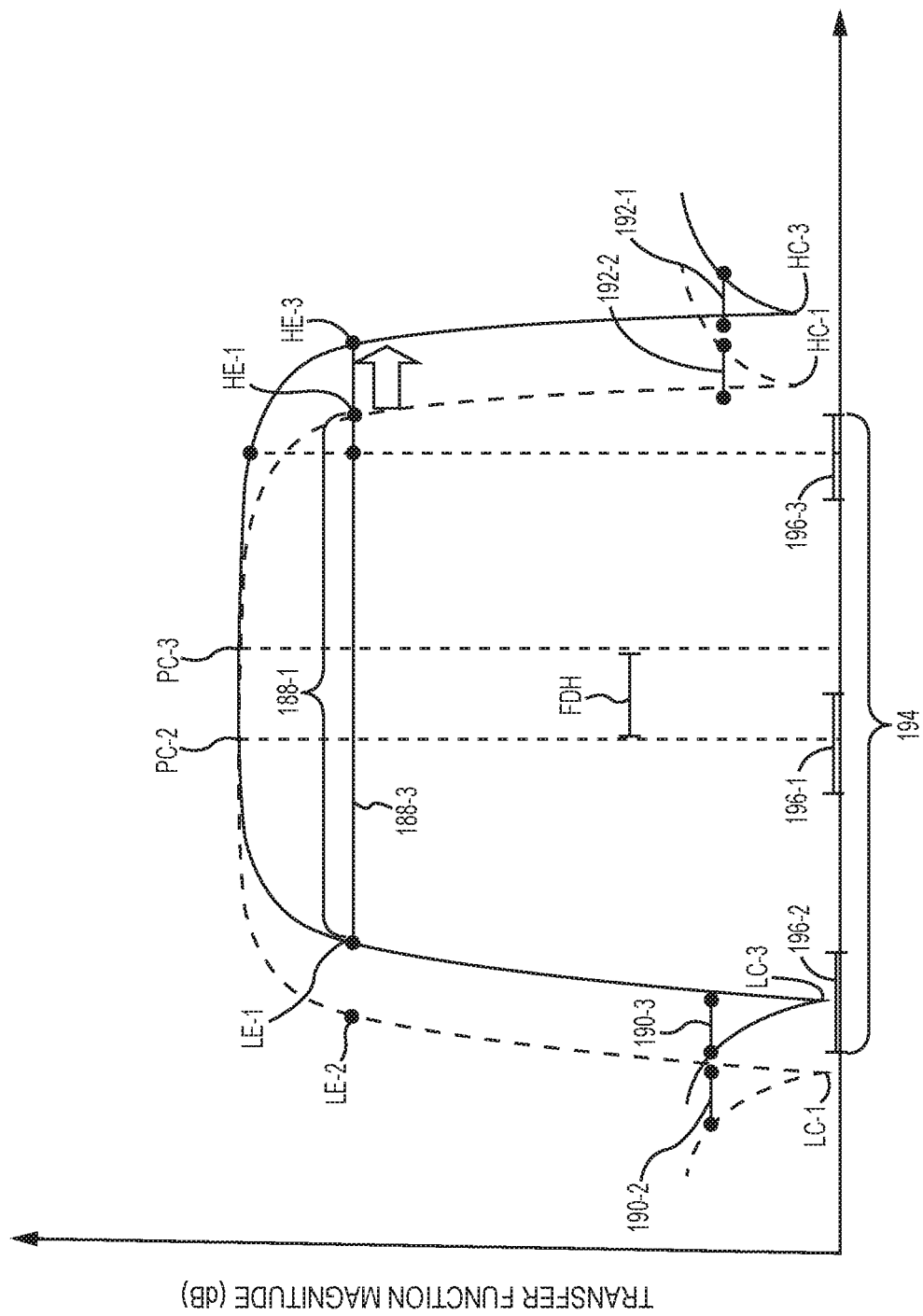

FIG. 6 demonstrates the shifting of the passband of one of the acoustic wave filters shown in FIG. 1 so that the passband is shifted so that the center frequency of the passband is moved towards the selected channel and a high frequency edge of the passband is moved away from the selected channel.

Figure 7:
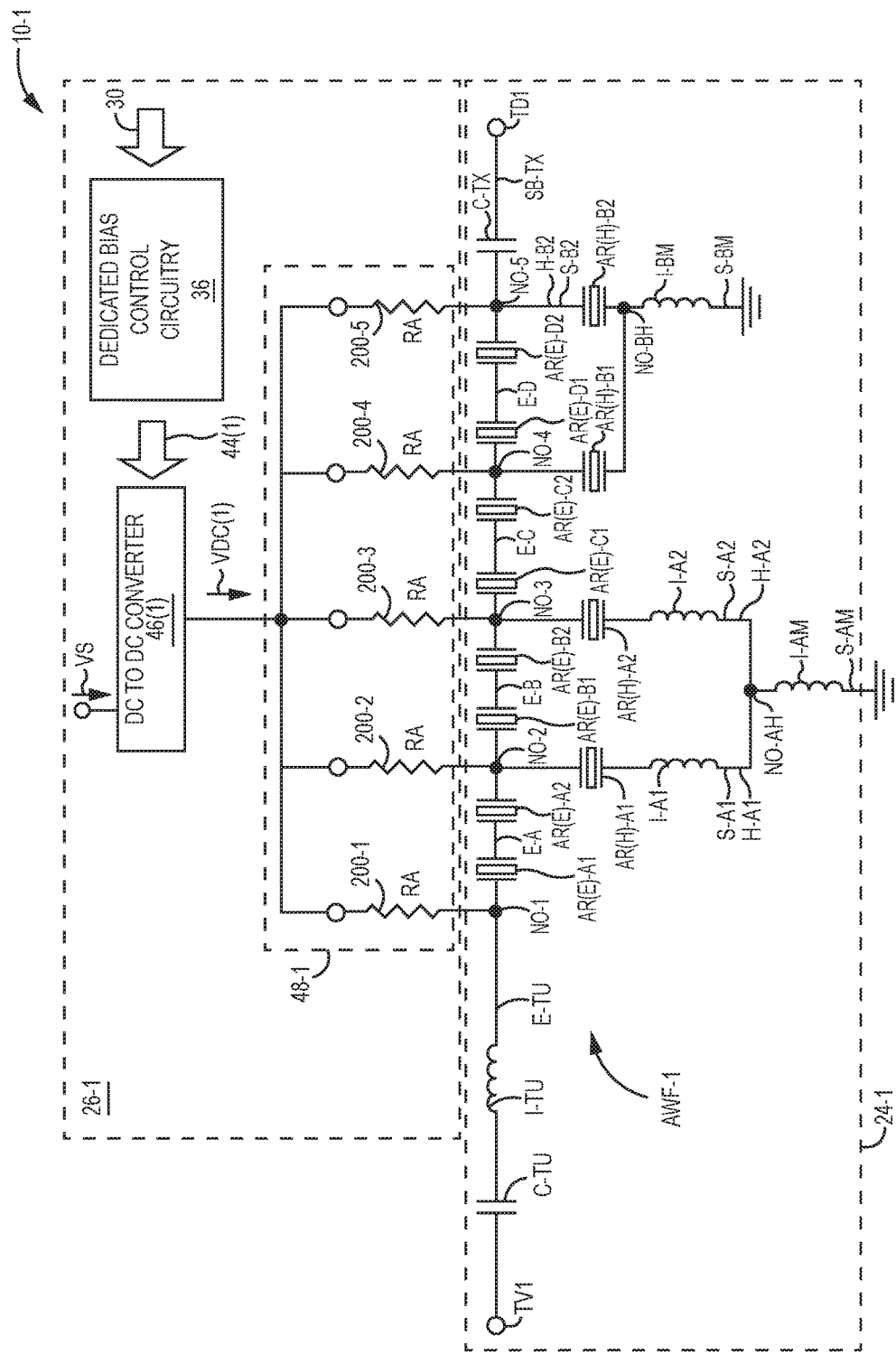

FIG. 7 illustrates one embodiment of the acoustic wave filtering system shown in FIG. 1 that includes an acoustic wave filter having series coupled resonators and shunt coupled resonators and acoustic wave tuning control circuitry that only biases the shunt coupled resonators.

Figure 8:
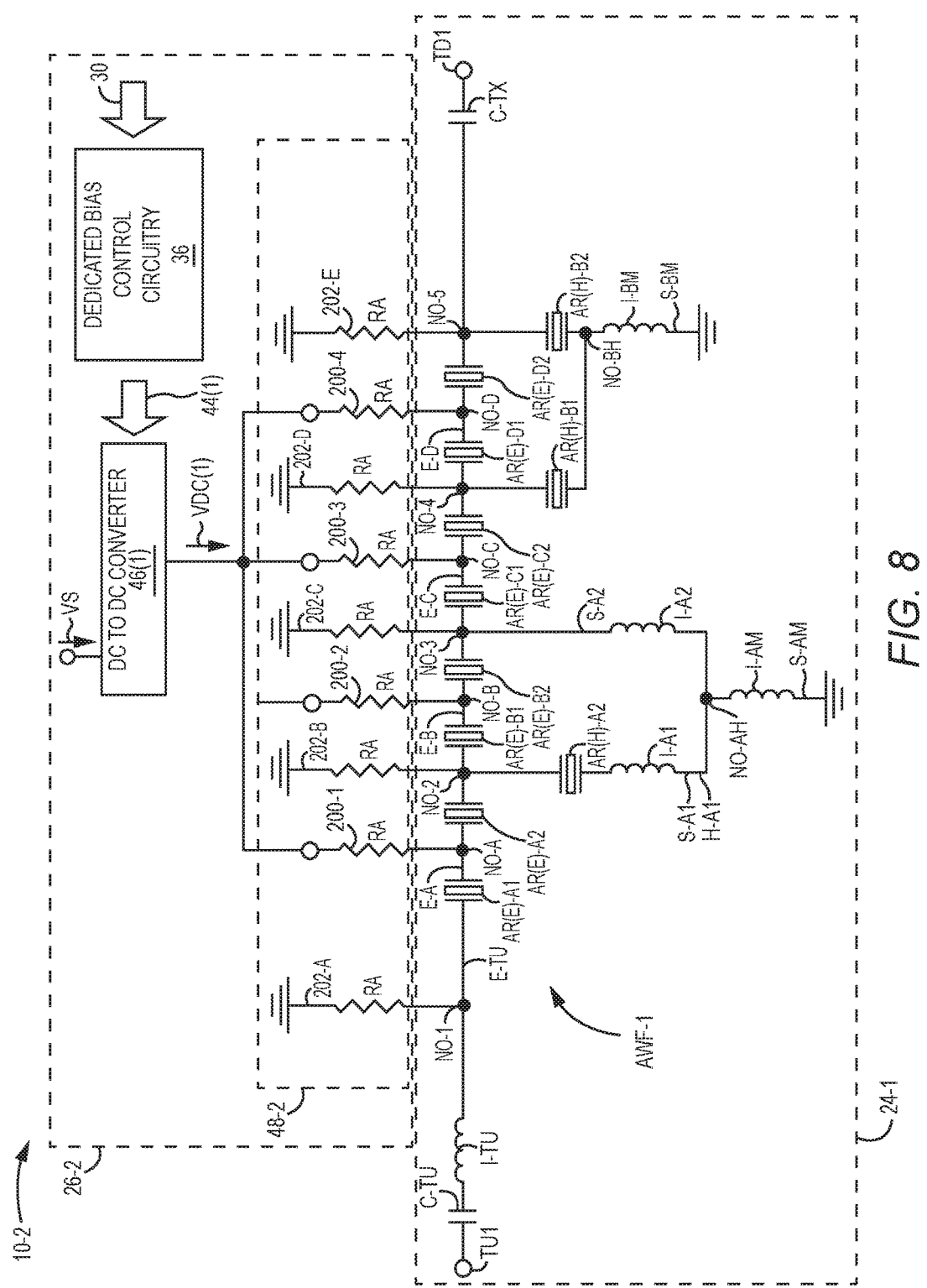

FIG. 8 illustrates one embodiment of the acoustic wave filtering system shown in FIG. 1 that includes the same acoustic wave filter shown in FIG. 7 but acoustic wave tuning control circuitry that only biases the series coupled resonators.

Figure 9:
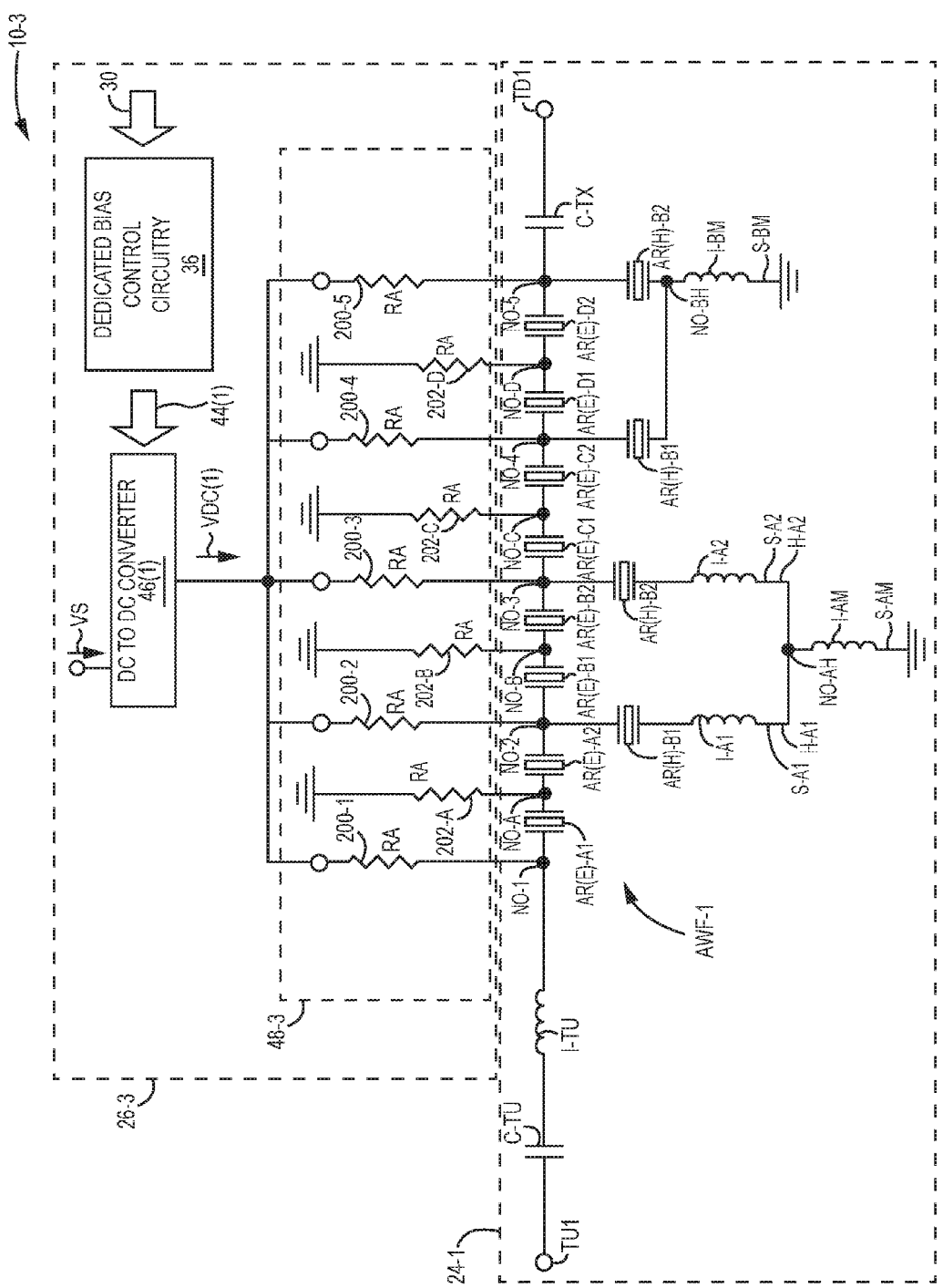

FIG. 9 illustrates one embodiment of the acoustic wave filtering system shown in FIG. 1 that includes the same acoustic wave filter shown in FIG. 7 but acoustic wave tuning control circuitry that biases both the series coupled resonators and the shunt coupled resonators.

Figure 10:
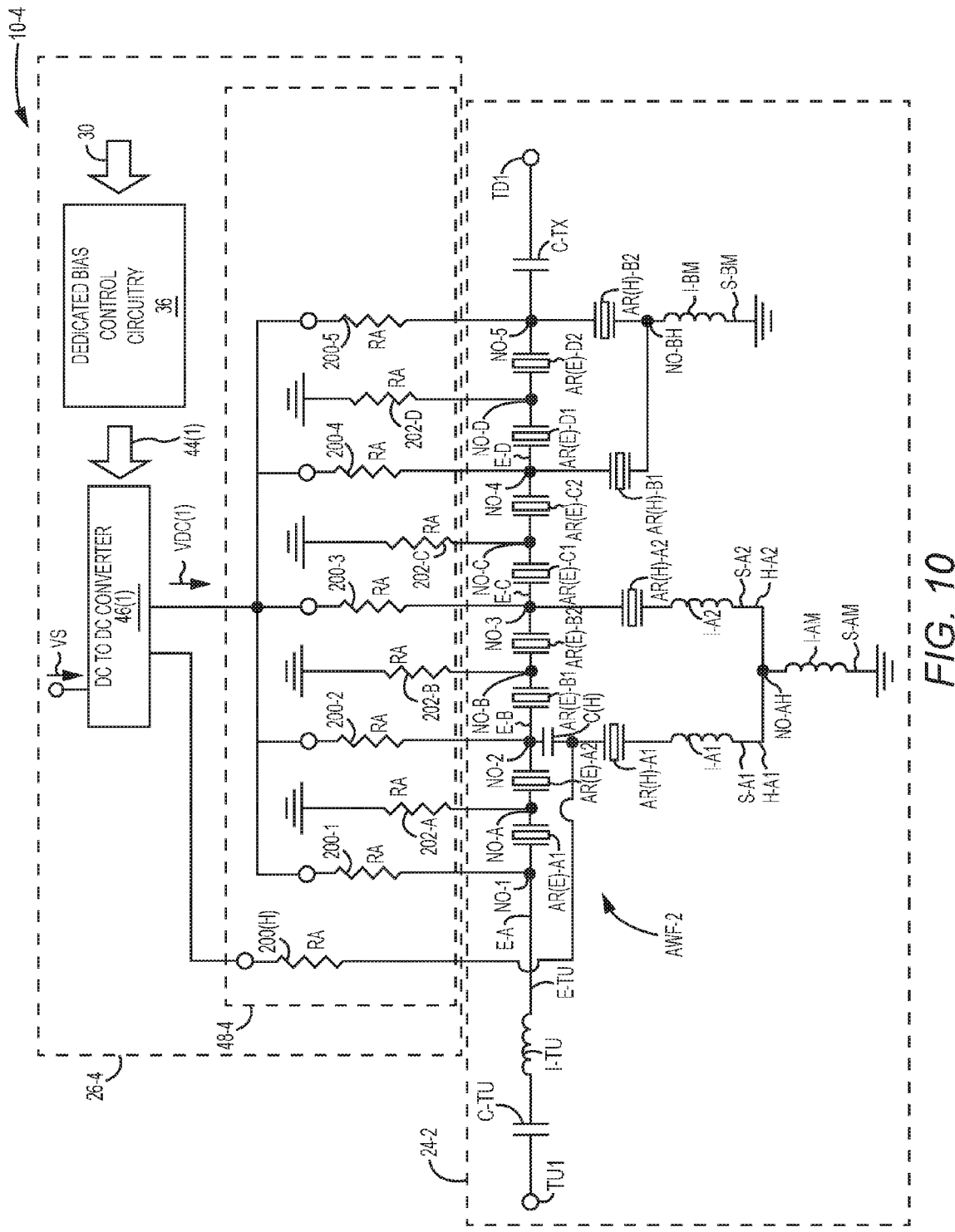

FIG. 10 illustrates one embodiment of the acoustic wave filtering system shown in FIG. 1 that includes an acoustic wave filter and acoustic wave tuning control circuitry that is the same as shown in FIG. 9, except that a capacitive element has been connected within a shunt branch with a shunt coupled acoustic wave resonator, and the acoustic wave tuning control circuitry is configured to apply a bias voltage between in the shunt branch between the capacitive element and the shunt coupled acoustic wave resonator.

Figure 11:
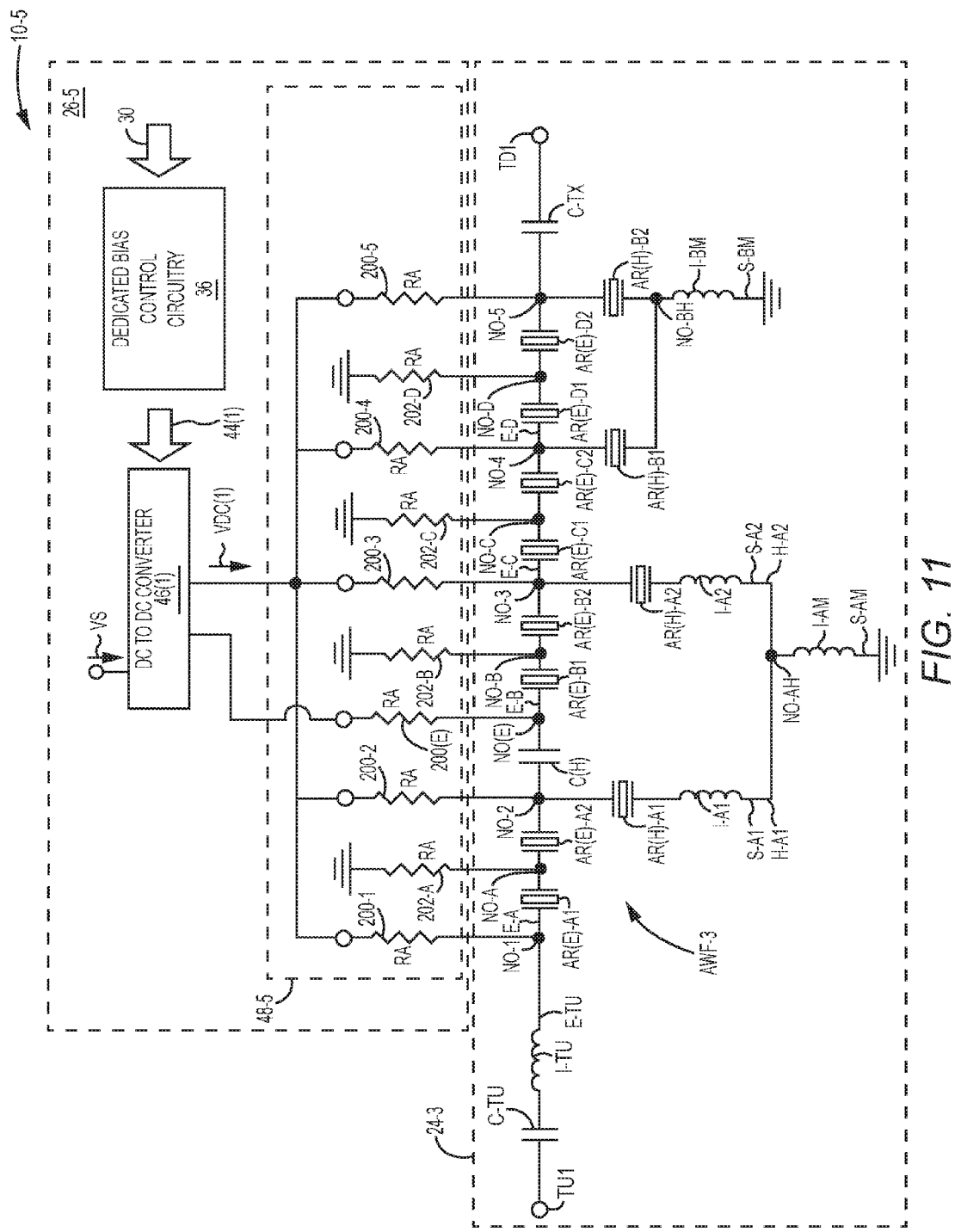

FIG. 11 illustrates one embodiment of the acoustic wave filtering system shown in FIG. 1 that includes an acoustic wave filter and acoustic wave tuning control circuitry that is the same as shown in FIG. 9, except that a capacitive element has been connected within a series branch with a series coupled acoustic wave resonator, and the acoustic wave tuning control circuitry is configured to apply a bias voltage between in the series branch between the capacitive element and the series coupled acoustic wave resonator.

Figure 12:
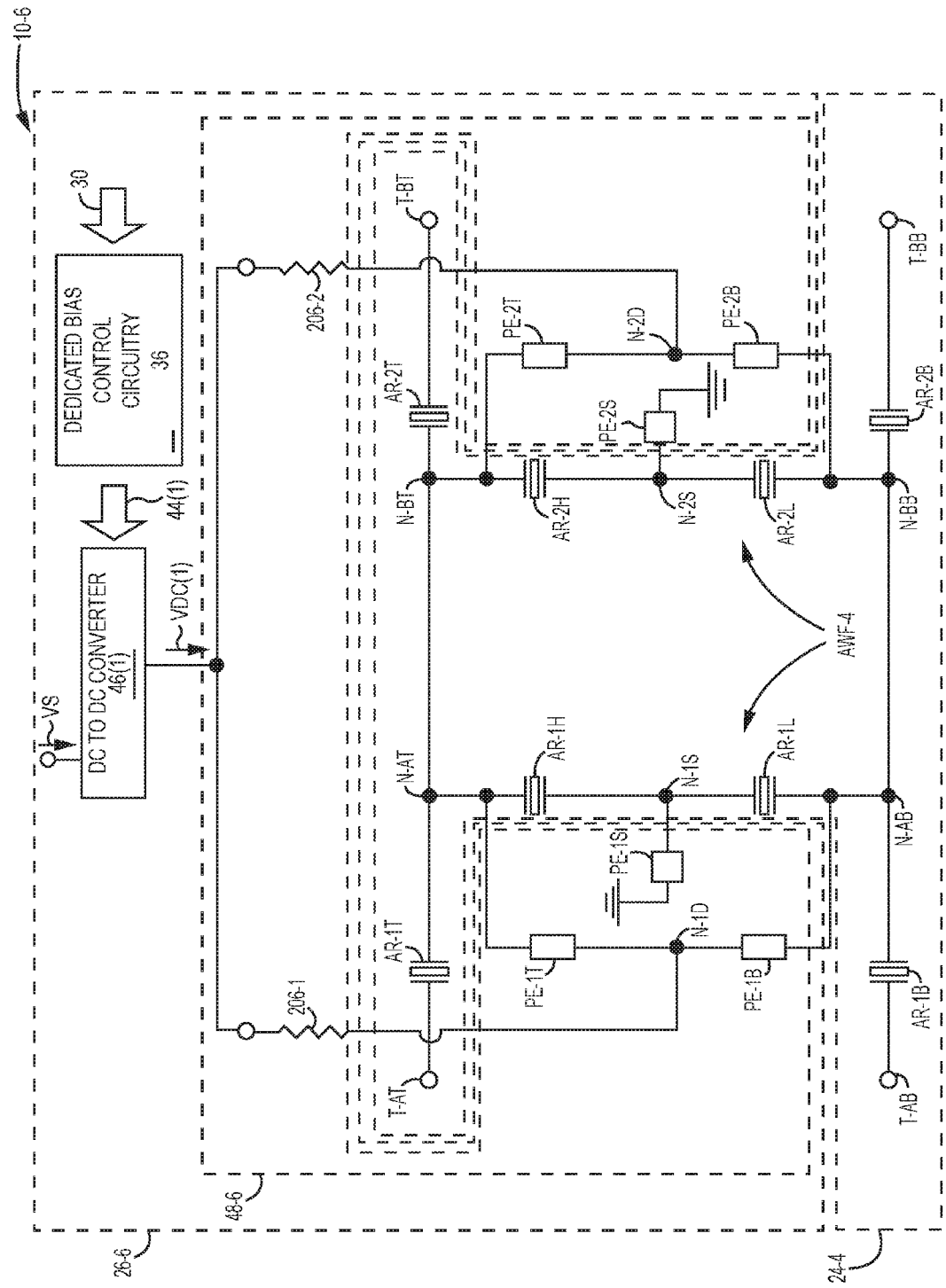

FIG. 12 illustrates one embodiment of the acoustic wave filtering system shown in FIG. 1 that includes an acoustic wave filter with acoustic wave resonators in a lattice configuration.

Figure 13:
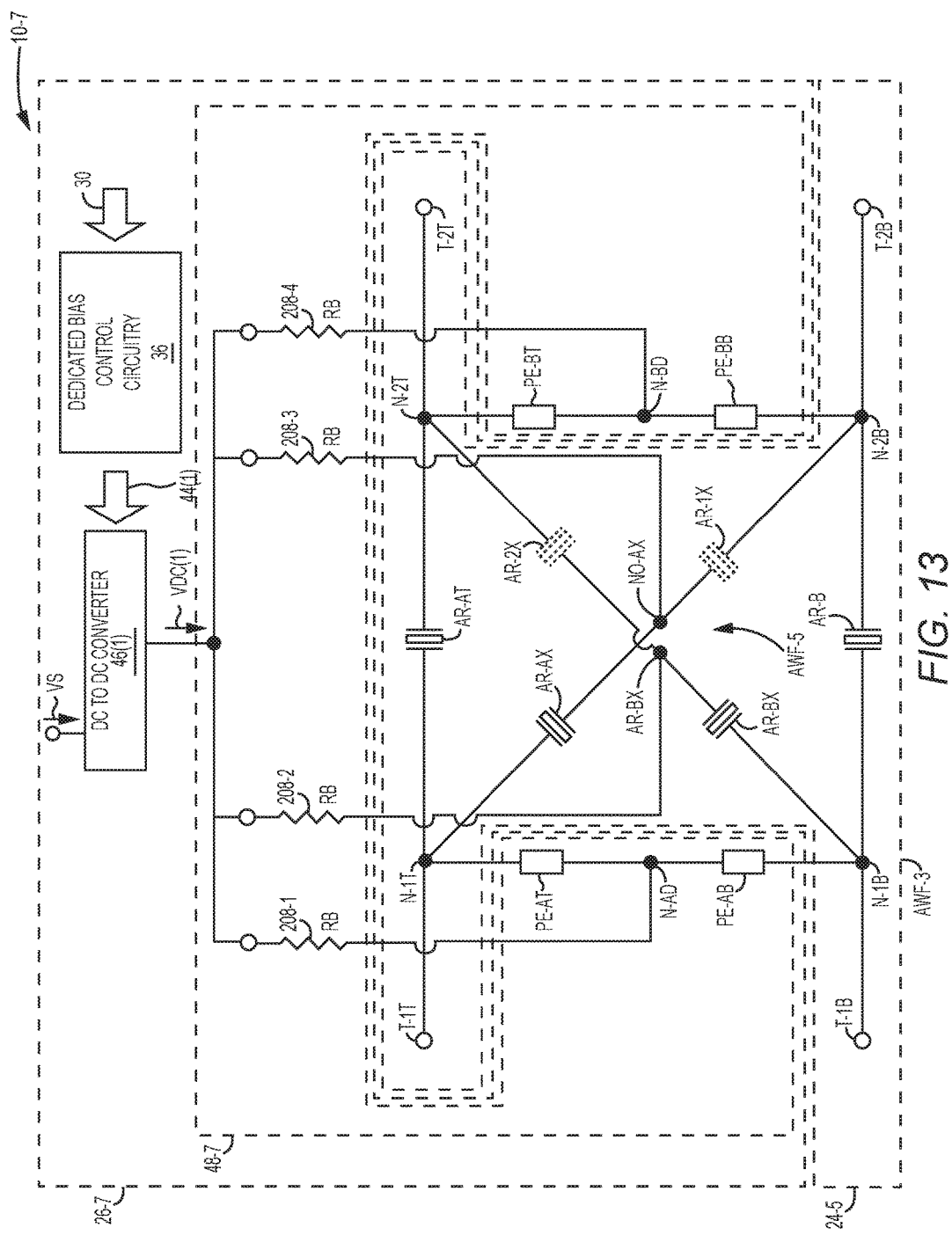

FIG. 13 illustrates one embodiment of the acoustic wave filtering system shown in FIG. 1 that includes an acoustic wave filter with acoustic wave resonators in a ladder configuration.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Throughout this disclosure, relative terminology, such as "approximately," "substantially," and the like, may be used with a predicate to describe features and relationships between features of a device or method. The relative terminology used with the predicate should be interpreted sensu lato. However, whether the predicate as modified by the relative terminology is satisfied is determined in accordance to error ranges and/or variation tolerances relevant to the predicate and/or prescribed to the device or method by radio frequency (RF) front end circuitry communication standards relevant to the RF application(s) employing the device or method. For example, the particular RF application employing the device or method may be designed to operate in accordance with certain communication standards, specifications, or the like. These communication standards and specification may prescribe the error ranges and/or variation tolerances relevant to the predicate or may describe performance parameters relevant to the predicate from which the error ranges and/or variation tolerances for determining the criteria for the predicate as modified by the terminology can be deduced or inferred.

With regard to the term "terminus," a terminus refers to any component or set of components configured to input and/or output RF signal(s). To illustrate, a port may be provided as a node, port, pin, terminal, contact, connection pad, and/or the like or a set of the aforementioned components. For example, with regard to a single-ended signal, a terminus may be provided by a single node or a single terminal. However, in other embodiments for a differential signal, a terminus may be provided by a pair of terminals or nodes configured to receive and/or transmit differential signals.

This disclosure describes acoustic wave filtering systems that include acoustic wave filtering structures along with circuitry and methods for tuning those the acoustic wave filtering structures. More specifically, the acoustic wave filter systems include acoustic wave filtering structures that form one or more acoustic wave filters from networks of acoustic wave resonators, such as Surface Acoustic Wave resonators (SARs) and Bulk Acoustic Wave resonators (BARs). The acoustic wave filters provide transfer functions that define passbands, which are tunable by acoustic wave tuning control circuitry.

In particular, the acoustic wave tuning control circuitry is configured to generate bias voltages and provide bias voltage distribution networks that apply these bias voltages to the acoustic wave filters in order to bias the acoustic wave resonators in the acoustic wave filters in a desired manner. Biasing the acoustic wave resonator results in an electric field that creates a mechanical stress on the piezoelectric substrate of the acoustic wave resonators. Thus, the acoustical and therefore resonant characteristics are set by the bias seens across the acoustic wave resonator. To tune the the acoustic wave filters, the acoustic wave tuning control system adjusts the bias voltages. The adjustment of the bias voltages thereby changes the acoustical and therefore resonant characteristics of the acoustic wave resonators biased by the bias voltages. As such, the passbands of the acoustic wave filters are shifted. The tuning of the passbands can thereby be provided without physically altering the acoustic wave resonators. Furthermore, the shift in the passband can be provided with a high degree of accurancy since electronic circuitry can be employed to provide highly accurate and precise adjustments to the bias voltages and thus to the shift of the passband. In this manner, the acoustic wave filtering systems can be employed in wideband radio frequency (RF) applications where passbands have to provide high band integrity but sharp and accurate roll-off at the edges of the passband. The biased acoustic wave resonators biasing the acoustic wave resonator determine the acoustical properties of the pie the acoustic wave which may be employed to provide filtering for wideband applications. Furthermore, the acoustic wave filtering systems can be used to easily calibrate the passband and correct for passband misalignments due to fabrication or operational variations. Finally, the acoustic wave filtering systems allow for dynamic tuning of the passband so that the passband can be transposed between different RF communication bands.

FIG. 1 illustrates exemplary RF front end circuitry 10. The RF front end circuitry 10 is shown in FIG. 1 as including an exemplary acoustic wave filtering system 12, RF digital processing circuitry 14, a bus 16, input and output (I/O) interface circuitry 18, upstream RF circuitry 20, and downstream RF circuitry 22. The RF front end circuitry 10 may be provided in a user communication device, such as a laptop, a smart phone, a tablet, a personal computer, or the like. For example, the RF front end circuitry 10 may be an RF transceiver, and the upstream RF circuitry 20, the acoustic wave filtering system 12, and downstream RF circuitry 22 may be provided so as to form one or more transmit chains, receive chains, and/or transceiver chains of the RF transceiver. While the transmit chains, receive chains, and/or transceiver chains may be mutually exclusive, at least some of the transmit chains, the receive chains and/or the transceiver chains may utilize some of the same components and thus not be mutually exclusive.

In a transmit chain or in a transceiver chain, the upstream RF circuitry 20 may include baseband circuitry and up-conversion circuitry that generate an endogenous RF transmission signal and a power amplifier that amplifies the RF transmission signal for wireless transmission. Also, within the transmit chain or in the transceiver chain, the downstream RF circuitry 22 may provide antenna tuning matching circuits and an antenna, where the antenna provides wireless transmission of the endogenous RF transmission signal to external communication devices (e.g., a cellular tower).

In a receive chain or in a transceiver chain, the upstream RF circuitry 20 may include a low noise amplifier, antenna tuning matching circuits, and an antenna (which may be the same or different than the one described above), where the antenna provides reception of exogenous RF receive signals transmitted wirelessly from external communication systems (e.g., a cellular tower). On the other hand, in a receive chain or in a transceiver chain, the downstream RF circuitry 22 may provide baseband conversion circuitry and demodulation circuitry that extracts data from the exogenous RF receive signal.

The acoustic wave filtering system 12 shown in FIG. 1 includes an acoustic wave resonator structure 24 and acoustic wave tuning control circuitry 26 configured to tune the acoustic wave resonator structure 24, as explained in further detail below. The acoustic wave resonator structure 24 includes termini TU1-TUX that are connected to the upstream RF circuitry 20 and includes termini TD1-TDX connected to the downstream RF circuitry 22 where an integer X can be any number greater of equal to 1. The acoustic wave resonator structure 24 is configured to filter the RF transmission signals and RF receive signals provided by the receive chains, transmission chains, and/or transceiver chains. It should be noted that additional filtering components may be provided in the upstream RF circuitry 20 and/or downstream circuitry in order to provide signal filtering.

The operation of the components of the receive chains, transmit chains, and/or transceiver chains in the RF front end circuitry 10 is regulated and coordinated by the RF digital processing circuitry 14. The RF digital processing circuitry 14 sends and receives system commands, system parameters, and other digital information along the bus 16. For example, RF digital processing circuitry 14 is configured to generate a tuning control output 28 that is transmitted along the bus 16 to the I/O interface circuitry 18. The I/O interface circuitry 18 is configured to receive the tuning control output 28 on the bus 16 and translate the tuning control output 28 into a tuning control input 30 that is received by the acoustic wave tuning control circuitry 26. The I/O interface circuitry 18 is also configured to receive a tuning control output 32 on the bus 16 from the acoustic wave tuning control circuitry 26. The I/O interface circuitry 18 translates the tuning control output 32 into a tuning control input 34 that is received by the bus 16. The bus 16 is configured to transmit the tuning control input 34 to the RF digital processing circuitry 14. In this manner, the acoustic wave tuning control circuitry 26 can tune the acoustic wave resonator structure 24 in accordance with the commands and parameters provided by the bus 16 from the RF digital processing circuitry 14 and provide commands and parameters to the RF digital processing circuitry 14 relevant to the operations of the RF front end circuitry 10, as explained in further detail below.

Referring now to the acoustic wave resonator structure 24 shown in FIG. 1, the acoustic wave resonator structure 24 is includes a network of acoustic wave resonators (referred to generically or generally as acoustic wave resonators "AR" and specifically as acoustic wave resonators "AR1-ARM"). The acoustic wave resonator structure 24 may include one or more acoustic wave filters (referred to generically or generally as acoustic wave filters "AWF" and specifically as acoustic wave resonators "AWF(1)-AWF(X)"). Each of the acoustic wave filters AWF may include one or more of the acoustic wave resonators AR. The acoustic wave resonators AR may each be any suitable type of acoustic wave resonator such as a bulk acoustic wave resonator (BAR), a surface wave acoustic wave resonator (SAR), or the like.

Furthermore, the acoustic wave resonators AR within the acoustic wave filter structure 24 may all be the same type of acoustic wave resonator or different types of acoustic wave resonators. The acoustic wave resonators AR are each connected to one or more nodes within one of the acoustic wave filters AWF. Each of the acoustic wave filters AWF has a transfer function that defines a passband. The transfer function of each the acoustic wave filters AWF depends on the resonant characteristics of the acoustic wave resonators AR within the acoustic wave filter AWF and the topology in which those acoustic wave resonators AR within the acoustic wave filter AWF are arranged. Each of the acoustic wave resonators operates through electromechanical transduction where an electromechanical substrate transforms received electrical waves into mechanical acoustic waves. The mechanical acoustic waves propagate through the electromechanical substrate (e.g., a piezoelectric substrate) and are converted back into output electric waves.

Each of the acoustic wave resonators AR provides filtering based on the mechanical resonant characteristics provided by their internal configurations. However, due to the electromechanical transduction provided by the electrometrical substrate, the mechanical resonant characteristics of the acoustic wave resonators AR can be affected by an electronic signal. Thus, to tune the transfer function and passbands of the acoustic wave filters AWF, dedicated bias control circuitry 36 is configured to bias one or more of the acoustic wave resonators AR in each of the acoustic wave filters AWF with bias voltages (referred to generically as bias voltages VB and in particular bias voltages VB1-VBZ). More specifically, the circuitry 36 is configured to apply the bias voltages VB to nodes (referred to generally or generically as nodes "NO" and specifically as nodes "NO1-NOZ) of the acoustic wave filters AWF. This creates a bias acoustic wave across one or more of the acoustic wave resonators AR within each of the acoustic wave filters AWF. The bias results in an electric field acoustic wave across the acoustic wave resonator AR that causes a mechanical stress within the electromechanical substrate and thereby adjusts the mechanical resonant characteristics of the acoustic wave resonator AR. Accordingly, for each of the acoustic wave filters AWF, the transfer function of the acoustic wave filter AWF can be tuned by adjusting one or more of the bias voltages VB provided to the acoustic wave filter AWF. For example, the circuitry 36 is configured to adjust one or more of the bias voltages VB provided to any one of the acoustic wave filters AWF so that the acoustic wave filter AWF shifts the passband.

In this embodiment, the acoustic wave resonator structure 24 includes multiple acoustic wave filters AWF(1) to AWF (X), where X is an integer greater or equal to 2. Each of the acoustic wave filters AWF is connected between a corresponding one of the termini TU1-TUX (which are connected to the upstream RF circuitry 20) and a corresponding one of the termini TD1-TDX (connected to the downstream RF circuitry 22). As shown in FIG. 1, the acoustic wave filter AWF(1) includes acoustic wave resonators AR1, AR2, AR3, AR4, AR5 and nodes NO1, NO2. The acoustic wave filter AWF(1) is connected between the terminus TU1 and the terminus TD1 In this specific embodiment, the acoustic wave resonator AR1 is a series coupled acoustic wave resonator connected between the terminus TU1 and the node NO1. The acoustic wave resonator AR2 is a shunt coupled acoustic wave resonator connected between the node NO1 and ground. The acoustic wave resonator AR3 is a series coupled acoustic wave resonator connected between the node NO1 and the node NO2. The acoustic wave resonator AR4 is a shunt coupled acoustic wave resonator connected between the node NO2 and ground. The acoustic wave resonator AR5 is a series coupled acoustic wave resonator connected between the node NO2 and the terminus TD1.

The acoustic wave tuning control circuitry 26 is configured to apply the bias voltage VB1 to the node NO1 of the acoustic wave filter AWF(1) and to apply the bias voltage VB2 to the node NO2 of the acoustic wave filter AWF(1). Accordingly, the acoustic wave resonator AR1 is biased by the bias voltage VB1, the acoustic wave resonator AR2 is biased by the bias voltage VB1, the acoustic wave resonator AR3 is biased by the bias voltages VB1, VB2, the acoustic wave resonator AR4 is biased by the bias voltage VB2, and the acoustic wave resonator AR5 is biased by the bias voltage VB2. Note that the bias acoustic wave across the acoustic wave resonator AR3 is the difference between the bias voltage VB1 and the bias voltage VB2. The acoustic wave tuning control circuitry 26 is configured to adjust the bias voltages VB1, VB2 so that the acoustic wave filter AWF(1) shifts the passband of the acoustic wave filter AWF(1).

As shown in FIG. 1, the acoustic wave filter AWF(X) includes acoustic wave resonators AR6, AR7, AR8, AR9, ARM and nodes NO(Z-1), NOZ. The acoustic wave filter AWF(X) is connected between the terminus TUX and the terminus TDX. In this specific embodiment, the acoustic wave resonator AR6 is a series coupled acoustic wave resonator connected between the terminus TUX and the node NO(Z-1). The acoustic wave resonator AR7 is a shunt coupled acoustic wave resonator connected between the node NO(Z-1) and ground. The acoustic wave resonator AR8 is a series coupled acoustic wave resonator connected between the node NO(Z-1) and the node NOZ. The acoustic wave resonator AR9 is a shunt coupled acoustic wave resonator connected between the node NOZ and ground. The acoustic wave resonator ARM is a series coupled acoustic wave resonator connected between the node NOZ and the terminus TDX.

The acoustic wave tuning control circuitry 26 is configured to apply the bias voltage VBZ-1 to the node NO(Z-1) of the acoustic wave filter AWF(X) and to apply the bias voltage VBZ to the node NOZ of the acoustic wave filter AWF(X). Accordingly, the acoustic wave resonator AR6 is biased by the bias voltage VBZ-1, the acoustic wave resonator AR7 is biased by the bias voltage VBZ-1, the acoustic wave resonator AR8 is biased by the bias voltages VBZ-1, VBZ, the acoustic wave resonator AR9 is biased by the bias voltage VBZ, and the acoustic wave resonator ARM is biased by the bias voltage VBZ. Note that the bias acoustic wave across the acoustic wave resonator AR8 is the difference between the bias voltage VBZ-1 and the bias voltage VBZ. The acoustic wave tuning control circuitry 26 is configured to adjust the bias voltages VBZ-1, VBZ so that the acoustic wave filter AWF(X) shifts the passband of the acoustic wave filter AWF(X).

The acoustic wave filtering structure 24 is operable to filter RF signals within different RF communication bands of operation and different channels defined by the RF communication bands. Thus, the acoustic wave tuning control circuitry 26 is configured to shift each of the passbands of the acoustic wave filters AWF into any selected one of the different RF communication bands. The passbands can be suitable for wideband applications, and thus shifting the passband to a selected one of a set of different channels may or may not be necessary, as explained in further detail below. The RF signals within those are to be formatted in accordance with different RF communication standards, and/or to be provided in accordance with different RF communication specifications within those RF communication standards. Exemplary RF communication standards and specifications include 2G Global System for Mobile Communications (GSM) standard (i.e., a Digital Communication System (DCS) specification, a Personal Communications Service (PCS) specification), GSM specifications, Enhanced Data Rates for GSM Evolution (EDGE) specifications of the 3G standard, Wireless Fidelity (Wi-Fi) Local Area Network (LAN) standards, and/or different specifications of the Long Term Evolution (LTE) standard. Furthermore, the RF signals may be multiplexed in accordance with Time Division Duplex (TDD) techniques, Frequency Division Duplex (FDD) techniques, Space Division Multiplexing (SDM), Code Division Multiple Access Multiplexing (CDMA), Orthogonal Frequency Division Multiple Access Multiplexing (OFDMA), LTE diversity techniques, Multiple-Input and Multiple-Output (MIMO) techniques, and/or the like.

To tune the acoustic wave resonator structure 24, the RF digital processing circuitry 14 may be configured to generate the tuning control output 28. The tuning control output 28 may identify a selected RF communication band of operation for each of the acoustic wave filters AWF, identify a selected channel of operation for the selected RF communication band for each of the acoustic wave filters AWF, and provide calibration information for each of the acoustic wave filters AWF and/or other information relevant to the operation of the acoustic wave filtering system 12. The RF digital processing circuitry 14 may transmit the tuning control output 28 via the bus 16 to the I/O interface circuitry 18. The acoustic wave tuning control circuitry 26 may include digital, analog, or hybrid control elements with different control formats than the RF digital control circuitry 14. As such, the I/O interface circuitry 18 is configured to translate the tuning control output 28 into a tuning control input 30 in accordance with the formatting needed by the acoustic wave tuning control circuitry 26.

In FIG. 1, the acoustic wave tuning control circuitry includes the dedicated bias control circuitry 36, filter bias voltage generation circuitry 38, and temperature sensor(s) 40. Each of the temperature sensor(s) 40 is configured to measure a temperature of one of the acoustic wave filters AWF and generate a temperature output (referred to generically or generally as temperature outputs 42 and specifically as temperature outputs 42(1)-42(X)) that indicates the temperature that was measured. More specifically, one of the temperature sensor(s) 40 measures the temperature of the acoustic wave filter AWF(1) and generates a temperature output 42(1) that indicates the temperature measured. Another one of the temperature sensor(s) 40 measures the temperature of the acoustic wave filter AWF(X) and generates a temperature output 42(X) that indicates the temperature measured. The dedicated bias control circuitry 36 is operable to receive the tuning control input 30 from the I/O interface circuitry 18 and the temperature output 42 from the temperature sensors 40. The dedicated bias control circuitry 36 is configured to generate bias control outputs (referred to generically or generally as bias control outputs 44 and specifically as bias control outputs 44(1)-44(X)) for each of the acoustic wave filters AWF. More specifically, the dedicated bias control circuitry 36 generates the bias control output 44(1) to control the bias voltages VB1, VB2 that are applied to the acoustic wave filter AWF(1) and a bias control output 44(X) to control the bias voltages VBZ-1, VBZ that are applied to the acoustic wave filter AWF(X). The dedicated bias control circuitry 36 is configured to generate the bias control output 44(1) so that the bias control output 44(1) is set as a function of the selected RF communication band identified by the tuning control input 30 for the filter AWF(1), the selected channel within the selected RF communication band identified by the tuning control input 30, and the temperature indicated by the temperature output 42(1). The dedicated bias control circuitry 36 is configured to generate the bias control output 44(X) so that the bias control output 44(X) is set as a function of the selected RF communication band identified by the tuning control input 30 for the filter AWF(X), the selected channel within the selected RF communication band identified by the tuning control input 30, and the temperature indicated by the temperature output 42(X).

The filter bias voltage generation circuitry 38 is operable to receive the bias control outputs 44 from the dedicated bias control circuitry 36. The filter bias voltage generation circuitry 38 is configured to generate the bias voltages VBV, apply one or more of the bias voltages VB to each of the acoustic wave filters AWF, and adjust the bias voltages VB in accordance with the bias control outputs 44 so that the passbands of the filters AWF are shifted in accordance with the bias voltages VB. More specifically, the filter bias voltage generation circuitry 38 is configured to generate the bias voltages VB1, VB2 so that the bias voltages VB1, VB2 are adjusted in accordance with the bias control output 44(1). The filter bias voltage generation circuitry 38 is configured to apply the bias voltages VB1, VB2 to the filter AWF(1) as explained above. The bias control output 44(1) is generated by the dedicated bias control circuitry 36 so that the filter bias voltage generation circuitry 38 shifts the passband of the filter AWF(1) into the selected communication band (and, for non-wide band applications, the selected communication channel within the selected communication band) of the filter AWF(1) identified by the tuning control input 30 given the temperature of the filter AWF(1) indicated by the temperature output 42(1). The filter bias voltage generation circuitry 38 is configured to apply the bias voltages VBZ-1, VBZ to the filter AWF(X), as explained above. The bias control output 44(X) is generated by the dedicated bias control circuitry 36 so that the filter bias voltage generation circuitry 38 shifts the passband of the filter AWF(X) into the selected communication band (and, for non-wide band applications, the selected communication channel within the selected communication band) of the filter AWF(X) identified by the tuning control input 30 given the temperature of the filter AWF(X) indicated by the temperature output 42(X). It should be noted that the mechanical resonance characteristic of the acoustic wave resonators AR is dependent on temperature and thus determines the bias control voltages VB in accordance with measured temperatures, which can improve the performance of the acoustic wave filters AWF.

In FIG. 1, the filter bias voltage generation circuitry 38 includes DC to DC converters (referred to generically or generally as DC to DC converters 46 and specifically as DC to DC converters 46(1)-46(X)) and a bias voltage distribution network 48 that is operably associated with each of the DC to DC converters 46. The DC to DC converters 46 are operable to receive a supply voltage VS and the bias control outputs 44. The supply voltage VS may be any type of supply voltage such as a power source voltage (e.g., a battery voltage) or a regulated supply voltage generated from the power source voltage. The DC to DC converters 46 generate DC control voltages (referred to generically or generally as DC voltages VDC and specifically as DC control voltages VDC(1)-VDC(X)) from the supply voltage VS and adjust the DC control voltages VDC in accordance with the bias control outputs 46. The bias voltage distribution network 48 is a network of passive elements (or mostly passive circuit elements). The bias voltage distribution network 48 is configured to produce the bias voltages VB in response to the DC control voltages VDC and apply the bias voltages VB to the filters AWF. As such, the bias voltage distribution network 48 is configured to adjust the bias voltages VDC in accordance with the DC control voltages VDC. In some embodiments, multi-level DC voltage output circuits (referred to generically or generally as multi-level DC voltage output circuits 50 and specifically as multi-level DC voltage output circuits 50(1)-50(X)) are connected between the DC to DC converters 46 and the bias voltage distribution network 48. Each of the multi-level DC voltage output circuits 50 is operable to receive a different one of the DC control voltages VDC in order to provide multi-level control as will be explained in further detail below.

More specifically, the filter bias voltage generation circuitry 38 includes the DC to DC converter 46(1). The DC to DC converter 46(1) is operable to receive the bias control output 44(1) from the dedicated bias control circuitry 36 and the supply voltage VS. The DC to DC converter 46(1) is configured to generate a DC control voltage VDC(1) from the supply voltage VS and adjust the DC control voltage VDC(1) in accordance with the bias control output 44(1). Thus, the DC to DC converter 46(1) provides the DC control voltage VDC(1) with a DC voltage level that is varied as a function of the bias control output 44(1). The DC to DC converter 46(1) may be a charge pump configured to adjust the DC voltage level of the DC control voltage VDC(1) in accordance with the bias control output 44(1). The DC voltage level of the DC control voltage VDC(1) may thus be provided at negative and positive DC voltage magnitudes. In this embodiment, the multi-level DC voltage output circuit 50(1) is operable to receive the DC control voltage VDC(1) from the DC to DC converter 46(1). The multi-level DC voltage output circuit 50(1) is configured to produce a plurality of DC control voltages VI(1)-VN(1) from the DC control voltage VDC(1). Thus, each of the DC control voltages VI(1)-VN(1) may have a different DC voltage level. However, the DC control voltages VI(1)-VN(1) are a function of the DC control voltage VDC(1). Thus, as the DC voltage level of the DC control voltage VDC(1) is adjusted in response to the bias control output 44(1), the multi-level DC voltage output circuit 50(1) adjusts the DC voltage level of each of the DC control voltages VI(1)-VN(1). In some embodiment, the multi-level DC voltage output circuit 50(1) is configured to generate all of the DC control voltages VI(1)-VN(1) simultaneously. In other embodiments, the multi-level DC voltage output circuit 50(1) may include switching circuitry to provide a selected one of the DC control voltages VI(1)-VN(1) at a time. For example, the multi-level DC voltage output circuit 50(1) may select a different one of the DC control voltages VI(1)-VN(1) depending on whether the passband is to be centered at a center frequency of a selected communication band, centered closer to a low frequency edge of the selected communication band, or centered closer to a high frequency edge of the selected communication band. This and other embodiments of the multi-level DC voltage output circuits 50(1) would be apparent to one of ordinary skill in the art in light of this disclosure.

In this embodiment, the bias voltage distribution network 48 is configured to receive the DC control voltages VI(1)-VN(1) from the multi-level DC voltage output circuit 50(1). The bias voltage distribution network 48 is configured to generate the bias voltages VB1, VB2 from the DC control voltages VI(1)-VN(1) and apply the bias voltages VB1, VB2 to the filter AWF(1), as described above. Accordingly, as the multi-level DC voltage output circuit 50(1) adjusts the DC control voltages VI(1)-VN(1), the bias voltage distribution network 48 is configured to adjust the bias voltages VB1, VB2. The bias voltage distribution network 48 is configured to apply the bias voltages VB1 to the node NO1 of the filter AWF(1) and to apply the bias voltage VB2 to the node NO2 of the filter AWF(1). The bias voltage VB1 is thus provided by the bias voltage distribution network 48 as having a bias voltage level that is DC and varies in accordance with the DC voltage levels of the DC control voltages VI(1)-VN(1). Similarly, the bias voltage VB2 is thus provided by the bias voltage distribution network 48 as having a bias voltage level that is DC and varies in accordance with the DC voltage levels of the DC control voltages VI(1)-VN(1). A topology of the bias voltage distribution network 48 determines the relationship between the bias voltage levels of the bias voltages VB1, VB2 and the DC voltage levels of the DC control voltages VI(1)-VN(1).

In another embodiment, the multi-level DC voltage output circuit 50(1) is not provided and the bias voltage distribution network 48 is configured to receive the DC control voltage VDC(1) directly from the DC to DC converter 46(1). The bias voltage distribution network 48 is configured to produce the bias voltages VB1, VB2 from the DC control voltage VDC(1) and apply the bias voltages VB1, VB2 to the filter AWF(1), as described above. Accordingly, as the DC to DC converter 46(1) adjusts the DC control voltages VI(1)-VN(1), the bias voltage distribution network 48 is configured to adjust the bias voltages VB1, VB2. The bias voltage distribution network 48 is configured to apply the bias voltage VB1 to the node NO1 of the filter AWF(1) and to apply the bias voltage VB2 to the node NO2 of the filter AWF(1). The bias voltage VB1 is thus provided by the bias voltage distribution network 48 as having a bias voltage level that is DC and varies in accordance with the DC voltage level of the DC control voltage VDC(1). Similarly, the bias voltage VB2 is thus provided by the bias voltage distribution network 48 as having a bias voltage level that is DC and varies in accordance with the DC voltage level of the DC control voltage VDC(1). A topology of the bias voltage distribution network 48 determines the relationship between the bias voltage levels of the bias voltages VB1, VB2 and the DC voltage level of the DC control voltage VDC(1).

The bias voltage distribution network 48 is configured to produce the bias voltages VB1, VB2 to bias the acoustic wave resonators AR1, AR2, AR3, AR4, AR5 within the filter AWF(1). Thus, adjusting the bias voltages VB1, VB2 adjusts the mechanical resonance characteristics of the acoustic wave resonators AR1, AR2, AR3, AR4, AR5. The filter AWF(1) is configured to shift the passband in response to the bias voltages VB1, VB2 being adjusted. A frequency displacement in the shift of the passband of the filter AWF(1) is a function of a change in the bias voltages VB1, VB2. The dedicated control circuitry 36 is configured to generate the bias control output 44(1) so that the filter bias voltage generation circuit 38 changes the bias voltage levels of the bias voltages VB1, VB2 by an amount that shifts the passband of the filter AWF(1) by a desired frequency displacement.

Furthermore, the filter bias voltage generation circuitry 38 includes the DC to DC converter 46(X). The DC to DC converter 46(X) is operable to receive the bias control output 44(X) from the dedicated bias control circuitry 36 and the supply voltage VS. The DC to DC converter 46(X) is configured to generate a DC control voltage VDC(X) from the supply voltage VS and adjust the DC control voltage VDC(X) in accordance with the bias control output 44(X). Thus, the DC to DC converter 46(X) provides the DC control voltage VDC(X) with a DC voltage level that is varied as a function of the bias control output 44(X). The DC to DC converter 46(X) may be a charge pump configured to adjust the DC voltage level of the DC control voltage VDC(X) in accordance with the bias control output 44(X). The DC voltage level of the DC control voltage VDC(X) may thus be provided at negative and positive DC voltage magnitudes. In this embodiment, a multi-level DC voltage output circuit 50(X) is operable to receive the DC control voltage VDC(X) from the DC to DC converter 46(X). The multi-level DC voltage output circuit 50(X) is configured to produce a plurality of DC control voltages VI(X)-VN(X) from the DC control voltage VDC(X). Thus, each of the DC control voltages VI(X)-VN(X) may have a different DC voltage level. However, the DC control voltages VI(X)-VN(X) are a function of the DC control voltage VDC(X). Thus, as the DC voltage level of the DC control voltage VDC(X) is adjusted in response to the bias control output 46(X), the multi-level DC voltage output circuit 50(X) adjusts the DC voltage level of each of the DC control voltages VI(X)-VN(X). In some embodiments, the multi-level DC voltage output circuit 50(X) is configured to generate all of the DC control voltages VI(X)-VN(X) simultaneously. In other embodiments, the multi-level DC voltage output circuit 50(X) may include switching circuitry to provide a selected one of the DC control voltages VI(X)-VN(X) at a time. For example, the multi-level DC voltage output circuit 50(X) may select a different one of the DC control voltages VI(X)-VN(X) depending on whether the passband is to be centered at a center frequency of a selected communication band, centered closer to a low frequency edge of the selected communication band, or centered closer to a high frequency edge of the selected communication band. This and other embodiments of the multi-level DC voltage output circuits 50(X) would be apparent to one of ordinary skill in the art in light of this disclosure.

In this embodiment, the bias voltage distribution network 48 is configured to receive the DC control voltages VI(X)-VN(X) from the multi-level DC voltage output circuit 50(X). The bias voltage distribution network 48 is configured to generate the bias voltages VBZ-1, VBZ from the DC control voltages VI(X)-VN(X) and apply the bias voltages VBZ-1, VBZ to the filter AWF(X), as described above. Accordingly, as the multi-level DC voltage output circuit 50(X) adjusts the DC control voltages VI(X)-VN(X), the bias voltage distribution network 48 is configured to adjust the bias voltages VBZ-1, VBZ. The bias voltage distribution network 48 is configured to apply the bias voltages VBZ-1 to the node NO(Z-1) of the filter AWF(X) and to apply the bias voltage VBZ to the node NOZ of the filter AWF(X). The bias voltage VBZ-1 is thus provided by the bias voltage distribution network 48 as having a bias voltage level that is DC and varies in accordance with the DC voltage levels of the DC control voltages VI(X)-VN(X). Similarly, the bias voltage VBZ is thus provided by the bias voltage distribution network 48 as having a bias voltage level that is DC and varies in accordance with the DC voltage levels of the DC control voltages VI(X)-VN(X). A topology of the bias voltage distribution network 48 determines the relationship between the bias voltage levels of the bias voltages VBZ-1, VBZ and the DC control voltages VI(X)-VN(X).

In another embodiment, the multi-level DC voltage output circuit 50(X) is not provided and the bias voltage distribution network 48 is configured to receive the DC control voltage VDC(X) directly from the DC to DC converter 46(X). The bias voltage distribution network 48 is configured to produce the bias voltages VBZ-1, VBZ from the DC control voltage VDC(X) and apply the bias voltages VBZ-1, VBZ to the filter AWF(X), as described above. Accordingly, as the DC to DC converter 46(X) adjusts the DC control voltages VI(X)-VN(X), the bias voltage distribution network 48 is configured to adjust the bias voltages VBZ-1, VBZ. The bias voltage distribution network 48 is configured to apply the bias voltages VBZ-1 to the node NO(Z-1) of the filter AWF(X) and to apply the bias voltage VBZ to the node NOZ of the filter AWF(X). The bias voltage VBZ-1 is thus provided by the bias voltage distribution network 48 as having a bias voltage level that is DC and varies in accordance with the DC voltage level of the DC control voltage VDC(X). Similarly, the bias voltage VBZ is thus provided by the bias voltage distribution network 48 as having a bias voltage level that is DC and varies in accordance with the DC voltage level of the DC control voltage VDC(X). A topology of the bias voltage distribution network 48 determines the relationship between the bias voltage levels of the bias voltages VBZ-1, VBZ and the DC voltage level of the DC control voltage VDC(X).

The bias voltage distribution network 48 is configured to produce the bias voltages VBZ-1, VBZ which bias the acoustic wave resonators AR6, AR7, AR8, AR9, ARM within the filter AWF(X). Thus, adjusting the bias voltages VBZ-1, VBZ adjusts the mechanical resonance characteristics of the acoustic wave resonators AR6, AR7, AR8, AR9, ARM. The filter AWF(X) is configured to shift the passband in response to the bias voltages VBZ-1, VBZ being adjusted. A frequency displacement in the shift of the passband of the filter AWF(X) is a function of a change in the bias voltages VBZ-1, VBZ. The dedicated control circuitry 36 is configured to generate the bias control output 44(X) so that the filter bias voltage generation circuit 38 changes the bias voltage levels of the bias voltages VBZ-1, VBZ by an amount that shifts the passband of the filter AWF(X) by a desired frequency displacement.

It should be noted that the acoustic wave filtering system 12 shown in FIG. 1 is exemplary and intended to describe the general concepts in this disclosure. Different configurations may be needed depending on the filtering application and are considered to be within the scope of this disclosure. The acoustic wave filtering structure 24 is also exemplary. Alternative embodiments of the acoustic wave filtering structure 24 may have the acoustic wave resonators AR in any desired topology to form a desired filtering network. The acoustic wave resonators AR may also be any type of acoustic wave resonator depending on the filtering application. For example in one embodiment, each of the acoustic wave resonators AR is a BAR.

Figure 2:
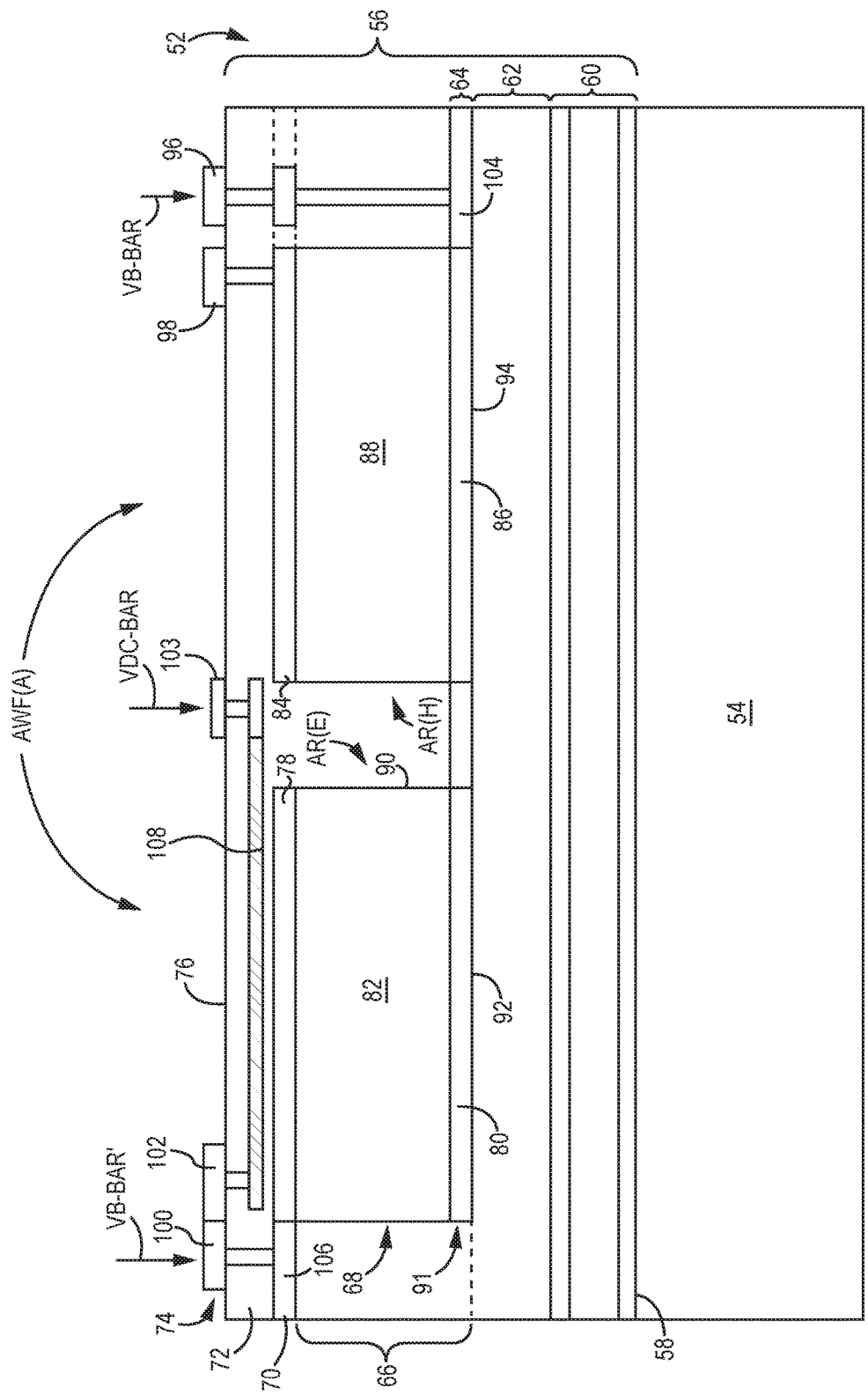
FIG. 2 illustrates one embodiment of a semiconductor die that forms a pair of non-stack acoustic wave resonators, which may be utilized in the acoustic wave filtering structure shown in FIG. 1.

FIG. 2 illustrates an example of a semiconductor die 52 that includes a BAR AR(E) and a BAR AR(H) of an acoustic wave filer AWF(A). Thus any one or every one of the acoustic wave filters AWF(1)-AWF(X) described above in FIG. 1 have the acoustic wave resonators AR provided with the topology shown in FIG. 2. The acoustic wave resonator BAR AR(E) is a series coupled BAR connected in series within the acoustic wave filter AWF(A). Accordingly, any one or every one of the acoustic wave resonators AR1, AR3, AR5 of the acoustic wave filter AWF(1) shown in FIG. 1 and any one or every one of the acoustic wave resonators AR6, AR8, ARM of the acoustic wave filter AWF(X) shown in FIG. 1 may be provided as the BAR AR(E) shown in FIG. 2. The acoustic wave resonator BAR AR(H) is a shunt coupled BAR connected in shunt within the acoustic wave filter AWF(A). Accordingly, any one or every one of the acoustic wave resonators AR2, AR4 of the acoustic wave filter AWF(1) shown in FIG. 1 and any one or every one of the acoustic wave resonators AR7, AR9 of the acoustic wave filter AWF(X) shown in FIG. 1 may be provided as the BAR AR(H) shown in FIG. 2.

The semiconductor die 52 includes a semiconductor wafer 54 and a BAR region 56 formed over a surface 58 of the semiconductor wafer 54. The BAR region 56 includes a bragg mirror 60, dielectric layer 62, a metallic layer 64, a dielectric layer 66, piezoelectric layer 68, a metallic layer 70, a dielectric layer 72, and a metallic layer 74. The bragg mirror 60 is formed on the surface 58 over the semiconductor wafer 54. The dielectric layer 62 is formed over the bragg mirror 60. The metallic layer 64 is formed over the dielectric layer 62. The dielectric layer 66 is formed over the metallic layer 64. However, the dielectric layer 66 has been divided into segments. Thus the piezoelectric layer 68 is within the dielectric layer 66. The dielectric layer 66 is formed on the metallic layer 64 and on the dielectric layer 62 that does not include the metallic layer 64. A metallic layer 70 is formed over the piezoelectric layer 68 and on the dielectric layer 66. A dielectric layer 72 is formed on the metallic layer 70 and over the dielectric layer 66. The dielectric layer 72 provides an exterior surface 76. The metallic layer 74 is formed on an exterior surface 76 of the dielectric layer 72.

The BAR AR(E) includes a top electrode 78, a bottom electrode 80, and a piezoelectric substrate 82 that is formed vertically between the top electrode 78 and the bottom electrode 80. The BAR AR(H) also includes a top electrode 84, a bottom electrode 86, and a piezoelectric substrate 88 that is formed vertically between the top electrode 84 and the bottom electrode 86. In this embodiment however, the piezoelectric substrate 82 and the piezoelectric substrate 88 are both formed by the piezoelectric layer 68. More specifically, the piezoelectric substrate 82 of the BAR AR(E) is formed by a segment 90 of the piezoelectric layer 68, while the piezoelectric substrate 88 of the BAR AR(H) is formed by a segment 92 of the piezoelectric layer 68. The segment 90 that forms the piezoelectric substrate 82 of the BAR AR(E) and the segment 92 that forms the piezoelectric substrate 88 of the BAR AR(H) are separated from one another and thus the BAR AR(E) and the BAR AR(H) are horizontally displaced. However, the BAR AR(E) and the BAR AR(H) are on the same vertical level. Thus, the BAR AR(E) and the BAR AR(H) are not stacked.

In this embodiment, the top electrode 78 and the top electrode 84 are both formed from the metallic layer 70. However, the top electrode 78 and the top electrode 84 are formed by the metallic layer 70 as separated conductive plates, and therefore the bottom electrode 80 and the top electrode 84 are not connected. However, the metallic layer 64 forms a conductive plate 91. Both the bottom electrode 80 and the bottom electrode 86 are formed by the conductive plate 91. Thus, as shown in FIG. 2, the bottom electrode 80 of the BAR AR(E) is formed from a portion 92 of the conductive plate 91 while the bottom electrode 86 of the BAR AR(H) is formed from a portion 94 of the conductive plate 91. As such, both the bottom electrode 80 of the BAR AR(E) and the bottom electrode 86 of the BAR AR(H) are both not separated since both are formed from portions 92, 94 of the same conductive plate 91, the bottom electrode 86 and the conductive plate 91 are directly connected.

The metallic layer 74 on the exterior surface 76 is shaped to form contact pads 96, 98, 100, 102, 103 accessible from the exterior of the semiconductor die 52. With regard to the bottom electrodes 80, 86 of the BAR AR(E) and the BAR AR(H), the metallic layer 64 that forms the bottom electrodes 80, 86 also forms a capture pad 104 connected through a stack of vias to the contact pad 96. A bias voltage VB-BAR may be applied to the contact pad 96 and may thus apply the bias voltage VB-BAR to both the bottom electrodes 80, 86 of the BAR AR(E) and the BAR AR(H). The contact pad 96 may be any one of the nodes NO1, NO2, NO(Z-1), and NOZ shown in FIG. 1 that applies one of the bias voltages VB to the series coupled acoustic wave resonator(s) AR1, AR3, AR5, AR6, AR8, ARM and the shunt coupled acoustic wave resonator AR2, AR4, AR7, AR9 connected to the same node NO1, NO2, NO(Z-1), and NOZ. To connect the BAR AR(H) in shunt, the top electrode 84 has to be grounded. The top electrode 84 is connected by a via to the contact pad 98. Thus the contact pad 98 may be connected to ground. The top electrode 78 of the BAR AR(E) is connected directly to a capture pad 106 formed by the metallic layer. A capture pad 106 is connected by a via to the contact pad 100. The bias voltage VB-BAR' is applied to the contact pad 100. Thus, the BAR AR(E) is biased by the difference between the bias voltage VB-BAR' and the bias voltage VB-BAR, just like the acoustic wave resonators AR5, AR8 described above in FIG. 1.

Finally, as shown in FIG. 2, a thin resistive film 108 is provided in the dielectric layer 72. The thin resistive film 108 may be provided as a high resistance path with the bias voltage distribution network 48 shown in FIG. 1, as explained in further detail below. The thin resistive film 108 allows for ion beam etching to be utilized to determine the resistive value of the resistive path. In this embodiment, the thin resistive film 108 is connected to the contact pad 102 and the contact pad 103 by vias. The contact pad 102 is directly connected to the contact pad 100. The contact pad 103 receives a DC control voltage VDC-BAR, which may be any one of the DC control voltages, VDC, VI(1)-VI(X), VN(1)-VN(X) described above in FIG. 1. Accordingly, the configuration shown in FIG. 2 also allows for the bias voltage distribution network 48 to be formed by the same semiconductor die 52 that forms the acoustic wave resonators AR of the acoustic wave filtering structure 24 shown in FIG. 1.

Figure 3:
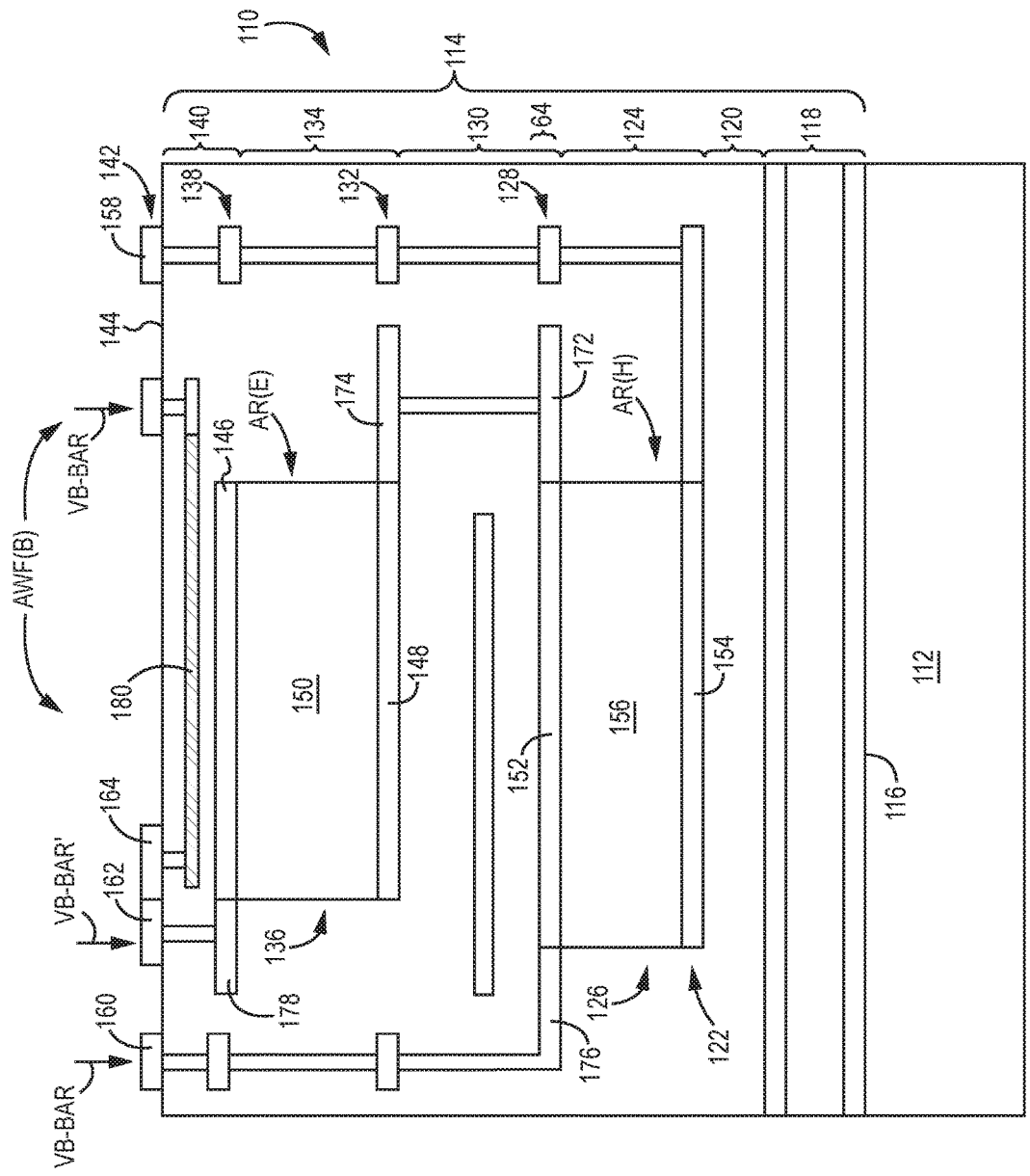
FIG. 3 illustrates another embodiment of a semiconductor die that forms a pair of non-stack acoustic wave resonators, which may be utilized in the acoustic wave filtering structure shown in FIG. 1.

FIG. 3 illustrates an example of a semiconductor die 110 that includes another embodiment of the BAR AR(E) and another embodiment of the BAR AR(H) of an acoustic wave resonator AWF(B). Thus any one or every one of the acoustic wave filters AWF(1)-AWF(X) described above in FIG. 1 has the acoustic wave resonators AR provided with the topology shown in FIG. 3. The acoustic wave resonator BAR AR(E) is a series coupled BAR connected in series within the acoustic wave filter AWF(B). Accordingly, any one or every one of the acoustic wave resonators AR1, AR3, AR5 of the acoustic wave filter AWF(1) shown in FIG. 1 and any one or every one of the acoustic wave resonators AR6, AR8, ARM of the acoustic wave filter AWF(X) shown in FIG. 1 may be provided as the BAR AR(E) shown in FIG. 3. The acoustic wave resonator BAR AR(H) is a shunt coupled BAR connected in shunt within the acoustic wave filter AWF(B). Accordingly, any one or every one of the acoustic wave resonators AR2, AR4 of the acoustic wave filter AWF(1) shown in FIG. 1 and any one or every one of the acoustic wave resonators AR7, AR9 of the acoustic wave filter AWF(X) shown in FIG. 1 may be provided as the BAR AR(H) shown in FIG. 3.

The semiconductor die 110 includes a semiconductor wafer 112 and a BAR region 114 formed over a surface 116 of the semiconductor wafer 112. The BAR region 114 includes a bragg mirror 118, dielectric layer 120, a metallic layer 122, a dielectric layer 124, piezoelectric layer 126, a metallic layer 128, a decoupler structure 130, a metallic layer 132, a dielectric layer 134, a piezoelectric layer 136, a metallic layer 138, a dielectric layer 140, and a metallic layer 142. The bragg mirror 118 is formed on the surface 116 over the semiconductor wafer 112. The dielectric layer 120 is formed over the bragg mirror 118. The metallic layer 122 is formed over the dielectric layer 120. The dielectric layer 124 is formed over the metallic layer 122. However, the dielectric layer 124 has been divided into segments. Thus, the piezoelectric layer 126 is within the dielectric layer 124. The piezoelectric layer 126 is formed on the metallic layer 122 and on the dielectric layer 120 that is not covered by the metallic layer 122. A metallic layer 128 is formed over the piezoelectric layer 126 and on the dielectric layer 124. The decoupler structure 130 is formed on the metallic layer 128 and over the dielectric layer 124. The metallic layer 132 is formed over the decoupler structure 130. The dielectric layer 134 is formed over the metallic layer 132. However, the dielectric layer 134 has been divided into segments. Thus the piezoelectric layer 136 is within the dielectric layer 134. The dielectric layer 134 is formed on the metallic layer 132 and on the decoupler structure 130 that is not covered by the metallic layer 132. The piezoelectric layer 136 is formed on the metallic layer 132. The metallic layer 138 is formed over the piezoelectric layer 136 and on the dielectric layer 134. The dielectric layer 140 is formed on the metallic layer 138 and on the dielectric layer 134 not covered by the metallic layer 138. The dielectric layer 140 provides an exterior surface 144. The metallic layer 142 is formed on the exterior surface 144 of the dielectric layer 130.

The BAR AR(E) includes a top electrode 146, a bottom electrode 148, and a piezoelectric substrate 150 that is formed vertically between the top electrode 146 and the bottom electrode 148. The BAR AR(H) also includes a top electrode 152, a bottom electrode 154, and a piezoelectric substrate 156 that is formed vertically between the top electrode 152 and the bottom electrode 154. In this embodiment, however, the piezoelectric substrate 150 and the piezoelectric substrate 156 are both formed on the different piezoelectrical layers 126, 136, which are vertically stacked. More specifically, the piezoelectric substrate 150 of the BAR AR(E) is formed by the piezoelectric layer 136 while the piezoelectric substrate 156 of the BAR AR(H) is formed by the piezoelectric layer 126. Thus, the piezoelectric substrate 150 is formed directly above the piezoelectric substrate 156. The piezoelectric substrate 150 of the BAR AR(E) and the piezoelectric substrate 156 of the BAR AR(H) are separated from one another and are vertically displaced. However, the BAR AR(E) and the BAR AR(H) are on the same horizontal position. Thus, the BAR AR(E) is stacked over the BAR AR(H).

In this embodiment, the top electrode 146 is formed by the metallic layer 146, and the top electrode 152 is formed from the metallic layer 128. The bottom electrode 148 of the BAR AR(E) is formed by the metallic layer 132, while the bottom electrode 154 of the BAR AR(H) is formed by the metallic layer 122. Thus, the bottom electrode 148 is formed over and directly above the top electrode 152, which are vertically separated by the decoupler structure 130. However, the bottom electrode 148 is connected by a via to the top electrode 152.

The metallic layer 136 on the exterior surface 144 is shaped to form contact pads 158, 160, 162, 164, 166 accessible from the exterior of the semiconductor die 110. With regard to the bottom electrode 154 of the BAR AR(H), a capture pad 170 is also formed by the metallic layer 122. To connect the BAR AR(H) in shunt, the bottom electrode 158 has to be grounded. With regard to the bottom electrode 148 of the BAR AR(E) and the top electrode 152 of the BAR AR(H), the metallic layer 128 also forms a capture pad 172 while the metallic layer 132 also forms a capture pad 174. A via connects the capture pad 172 and the capture pad 174. The metallic layer 128 also forms a capture pad 176. The capture pad 176 is connected to the contact pad 160 by a via stack. The bias voltage VB-BAR may be applied to the contact pad 160 and thus may apply the bias voltage VB-BAR to both the top electrode 152 of the BAR AR(H) and the bottom electrode 148 of the BAR AR(E). The contact pad 160 may be any one of the nodes NO1, NO2, NO(Z-1), NOZ shown in FIG. 1 connected to one of the series coupled acoustic wave resonator(s) AR1, AR3, AR5, AR6, AR8, ARM and one of the shunt coupled acoustic wave resonator(s) AR2, AR4, AR7, AR9.

The top electrode 146 of the BAR AR(E) is connected by a via to the contact pad 162. Thus the contact pad 162 may be connected to ground. The top electrode 146 of the BAR AR(E) is connected directly to a capture pad 178 formed by the metallic layer 138. The capture pad 178 is connected by a via to the contact pad 162. The bias voltage VB-BAR' is applied to the contact pad 162. Thus, the BAR AR(E) is biased by the difference between the bias voltage VB-BAR' and the bias voltage VB-BAR, just like the acoustic wave resonators AR5, AR8 described above in FIG. 1.

Finally, as shown in FIG. 3, a thin resistive film 180 is provided in the dielectric layer 140. The thin resistive film 180 may be provided as a high resistance path with the bias voltage distribution network 48 shown in FIG. 1, as explained in further detail below. The thin resistive film 180 allows for ion beam etching to be utilized to determine the resistive value of the resistive path. In this embodiment, the thin resistive film 180 is connected to the contact pad 164 and the contact pad 166 by vias. The contact pad 164 is directly connected to the contact pad 162. The contact pad 168 receives a DC control voltage VDC-BAR, which may be any one of the DC control voltages, VDC, VI(1)-VI(X), VN(1)-VN(X) described above in FIG. 1. Accordingly, the configuration shown in FIG. 3 also allows for the bias voltage distribution network 48 to be formed by the same semiconductor die 110 that forms the acoustic wave resonators AR of the acoustic wave filtering structure 24 shown in FIG. 1.

Figure 4:
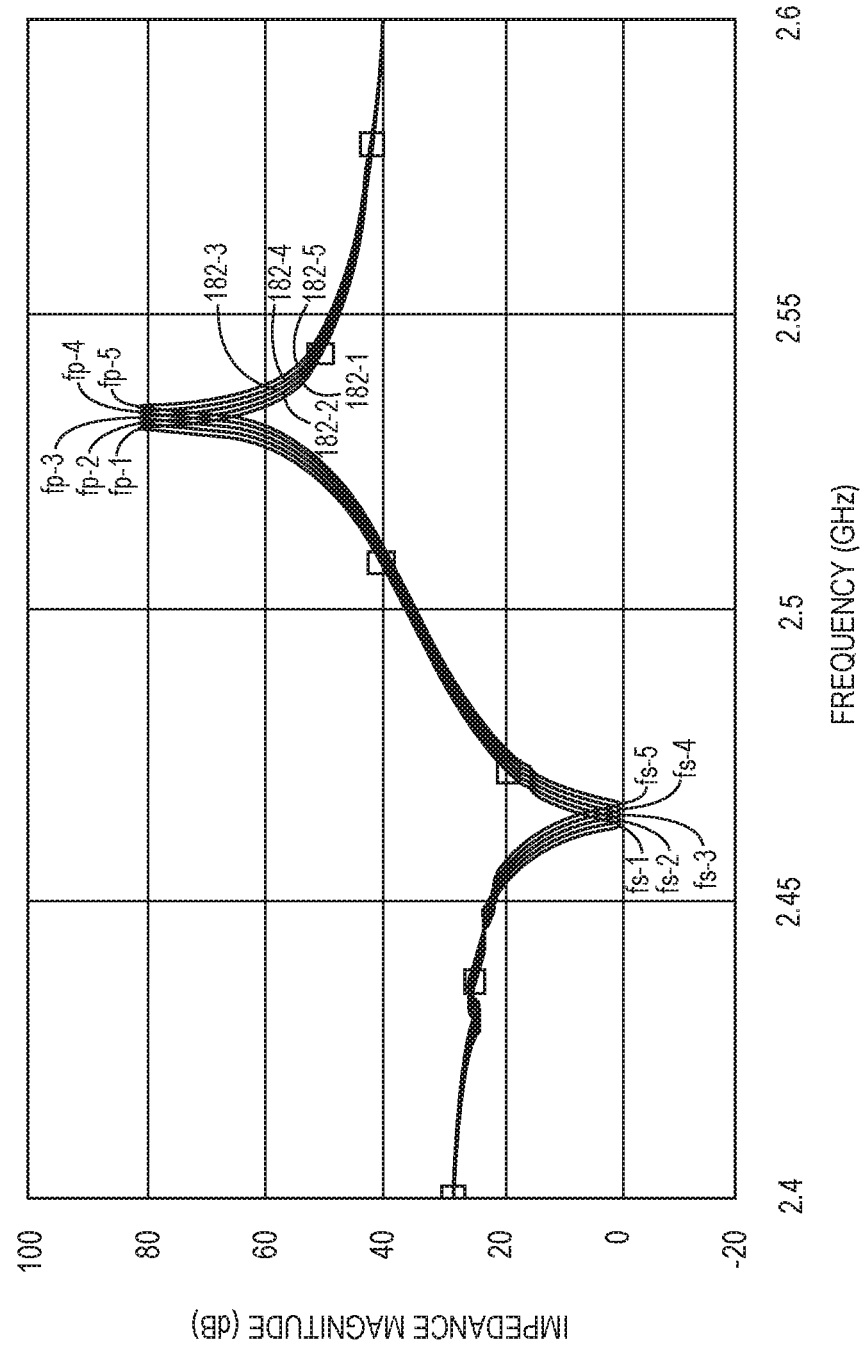
FIG. 4 illustrates impedance curves for the acoustic wave resonators shown in FIG. 2 and FIG. 3.

FIG. 4 illustrates embodiments of impedance curves (referred to generally or generically as impedance curves 182 and specifically as impedance curves 182-1, 182-2, 182-3, 182-4, 182-5) of an impedance from the top electrode (e.g., one of the top electrodes 78, 84, 146, 152) to the bottom electrode (e.g., one of the bottom electrodes 80, 86, 148, 154) of one of the BARs (e.g., one of the BARs BAR AR(E), BAR AR(H)) shown in FIG. 2 and FIG. 3 when the bias from the top electrode to the bottom electrode is provided at different bias voltage levels. More specifically, the impedance curve 182-1 describes the impedance of the BAR (from the top electrode to the bottom electrode) as a function of frequency when the bias from the top electrode to the bottom electrode is provided at −20V. The impedance curve 182-2 describes the impedance of the BAR (from the top electrode to the bottom electrode) as a function of frequency when the bias from the top electrode to the bottom electrode is provided at −10V. The impedance curve 182-3 describes the impedance of the BAR (from the top electrode to the bottom electrode) as a function of frequency when there is no bias (i.e. 0V) from the top electrode to the bottom electrode. The impedance curve 182-4 describes the impedance of the BAR (from the top electrode to the bottom electrode) as a function of frequency when the bias from the top electrode to the bottom electrode is provided at +10V. Finally, the impedance curve 182-5 describes the impedance of the BAR (from the top electrode to the bottom electrode) as a function of frequency when the bias from the top electrode to the bottom electrode is provided at +20V.

As shown by each of the impedance curves 182 in FIG. 4, the BAR is configured to provide a series resonance at a series resonant frequency (referred to generically or generally as series resonant frequency fs and specifically as impedance minima fs-1, fs-2, fs-3, fs-4, fs-5) where the BAR is configured to define an impedance minima (referred to generically or generally as impedance minima I and specifically as impedance minima I-1, I-2, I-3, I-4, I-5). Each of the impedance curves 182 also shows that the BAR is configured to provide a parallel resonance at a parallel resonant frequency (referred to generically or generally as parallel resonant frequency fp and specifically as impedance maxima fp-1, fp-2, fp-3, fp-4, fp-5). Thus, the BAR is configured to define an impedance maxima (referred to generically or generally as impedance maxima A and specifically as impedance maxima A-1, A-2, A-3, A-4, A-5) at the parallel resonant frequency fp.

As such, the series resonance and the parallel resonance of the BAR are used to provide poles within the passband of the acoustic wave filter (e.g., any one of the acoustic wave filters AWF(1)-AWF(X) within the acoustic wave resonator structure 24 shown in FIG. 1) along with zeros in a high edge stopband and a low edge stopband. The high edge stopband is defined by the transfer function of the acoustic wave filter that includes the BAR. The high edge stopband is provided by the roll-off from the high frequency edge of the passband and thus is defined by the transfer function to be adjacent to the passband. The low edge stopband is defined by the transfer function of the acoustic wave filter that includes the BAR. The low edge stopband is provided by the roll-off from the low frequency edge of the passband and thus is defined by the transfer function to also be adjacent to the passband.

More specifically, the impedance curve 182-1 shows that the BAR provides an impedance minima I-1 at the series resonant frequency fs-1 and provides an impedance maxima A-1 at the parallel resonant frequency fp-1 when the bias from the top electrode to the bottom electrode is provided at −20V. Accordingly, the impedance curve 182-1 shows that the BAR is configured to provide series resonance at a series resonant frequency fs-1 and provide parallel resonance at a parallel resonant frequency fp-1. The series resonant frequency fs-1 is lower than the parallel resonant frequency fp-1. Furthermore, the center frequency of the passband is higher than the series resonant frequency fs-1 but lower than the parallel resonant frequency fp-1. When the BAR is a series coupled BAR (e.g. the BAR AR(E) shown in FIG. 2 and in FIG. 3) within the acoustic wave filter (e.g., any one of the acoustic wave filters AWF(1)-AWF(X) within the acoustic wave filtering structure 24 shown in FIG. 1), the BAR is configured to define a pole within the passband of the acoustic wave filter at the series resonant frequency fs-1. Also, when the BAR is the series coupled BAR, the BAR is configured to define a zero within the high edge stopband at the parallel resonant frequency fp-1. In contrast, when the BAR is a shunt coupled BAR (e.g. the BAR AR(H) shown in FIG. 2 and in FIG. 3) within the acoustic wave filter (e.g., any one of the acoustic wave filters AWF(1)-AWF(X) within the acoustic wave filtering structure 24 shown in FIG. 1), the BAR is configured to define a pole within the passband of the acoustic wave filter at the parallel resonant frequency fp-1. Also, when the BAR is the shunt coupled BAR, the BAR is configured to define a zero within the low edge stopband at the series resonant frequency fs-1.

Next, the impedance curve 182-2 shows that the BAR provides an impedance minima I-2 at the series resonant frequency fs-2 and provides an impedance maxima A-2 at the parallel resonant frequency fp-2 when the bias from the top electrode to the bottom electrode is provided at −10V. Accordingly, the impedance curve 182-2 shows that the BAR is configured to provide series resonance at a series resonant frequency fs-2 and provide parallel resonance at a parallel resonant frequency fp-2. The series resonant frequency fs-2 is lower than the parallel resonant frequency fp-2. Furthermore, the center frequency of the passband is higher than the series resonant frequency fs-2 but lower than the parallel resonant frequency fp-1. When the BAR is a series coupled BAR (e.g. the BAR AR(E) shown in FIG. 2 and in FIG. 3) within the acoustic wave filter (e.g., any one of the acoustic wave filters AWF(1)-AWF(X) within the acoustic wave filtering structure 24 shown in FIG. 1), the BAR is configured to define a pole within the passband of the acoustic wave filter at the series resonant frequency fs-2. Also, when the BAR is the series coupled BAR, the BAR is configured to define a zero within the high edge stopband at the parallel resonant frequency fp-2. In contrast, when the BAR is a shunt coupled BAR (e.g. the BAR AR(H) shown in FIG. 2 and in FIG. 3) within the acoustic wave filter (e.g., any one of the acoustic wave filters AWF(1)-AWF(X) within the acoustic wave filtering structure 24 shown in FIG. 1), the BAR is configured to define a pole within the passband of the acoustic wave filter at the parallel resonant frequency fp-2. Also, when the BAR is the shunt coupled BAR, the BAR is configured to define a zero within the low edge stopband at the series resonant frequency fs-2.

Additionally, the impedance curve 182-3 shows that the BAR provides an impedance minima I-3 at the series resonant frequency fs-3 and provides an impedance maxima A-3 at the parallel resonant frequency fp-3 when there is no bias from the top electrode to the bottom electrode. Accordingly, the impedance curve 182-3 shows that the BAR is configured to provide series resonance at a series resonant frequency fs-3 and provide parallel resonance at a parallel resonant frequency fp-3. The series resonant frequency fs-3 is lower than the parallel resonant frequency fp-3. Furthermore, the center frequency of the passband is higher than the series resonant frequency fs-3 but lower than the parallel resonant frequency fp-1. When the BAR is a series coupled BAR (e.g. the BAR AR(E) shown in FIG. 2 and in FIG. 3) within the acoustic wave filter (e.g., any one of the acoustic wave filters AWF(1)-AWF(X) within the acoustic wave filtering structure 24 shown in FIG. 1), the BAR is configured to define a pole within the passband of the acoustic wave filter at the series resonant frequency fs-3. Also, when the BAR is the series coupled BAR, the BAR is configured to define a zero within the high edge stopband at the parallel resonant frequency fp-3. In contrast, when the BAR is a shunt coupled BAR (e.g. the BAR AR(H) shown in FIG. 2 and in FIG. 3) within the acoustic wave filter (e.g., any one of the acoustic wave filters AWF(1)-AWF(X) within the acoustic wave filtering structure 24 shown in FIG. 1), the BAR is configured to define a pole within the passband of the acoustic wave filter at the parallel resonant frequency fp-3. Also, when the BAR is the shunt coupled BAR, the BAR is configured to define a zero within the low edge stopband at the series resonant frequency fs-3.

Furthermore, the impedance curve 182-4 shows that the BAR provides an impedance minima I-4 at the series resonant frequency fs-4 and provides an impedance maxima A-4 at the parallel resonant frequency fp-4 when the bias from the top electrode to the bottom electrode is provided at +10V. Accordingly, the impedance curve 182-4 shows that the BAR is configured to provide series resonance at a series resonant frequency fs-4 and provide parallel resonance at a parallel resonant frequency fp-4. The series resonant frequency fs-4 is lower than the parallel resonant frequency fp-4. Furthermore, the center frequency of the passband is higher than the series resonant frequency fs-4 but lower than the parallel resonant frequency fp-1. When the BAR is a series coupled BAR (e.g. the BAR AR(E) shown in FIG. 2 and in FIG. 3) within the acoustic wave filter (e.g., any one of the acoustic wave filters AWF(1)-AWF(X) within the acoustic wave filtering structure 24 shown in FIG. 1), the BAR is configured to define a pole within the passband of the acoustic wave filter at the series resonant frequency fs-4. Also, when the BAR is the series coupled BAR, the BAR is configured to define a zero within the high edge stopband at the parallel resonant frequency fp-4. In contrast, when the BAR is a shunt coupled BAR (e.g. the BAR AR(H) shown in FIG. 2 and in FIG. 3) within the acoustic wave filter (e.g., any one of the acoustic wave filters AWF(1)-AWF(X) within the acoustic wave filtering structure 24 shown in FIG. 1), the BAR is configured to define a pole within the passband of the acoustic wave filter at the parallel resonant frequency fp-4. Also, when the BAR is the shunt coupled BAR, the BAR is configured to define a zero within the low edge stopband at the series resonant frequency fs-4.

Finally, the impedance curve 182-5 shows that the BAR provides an impedance minima I-5 at the series resonant frequency fs-5 and provides an impedance maxima A-5 at the parallel resonant frequency fp-5 when the bias from the top electrode to the bottom electrode is provided at +20V. Accordingly, the impedance curve 182-5 shows that the BAR is configured to provide series resonance at a series resonant frequency fs-5 and provide parallel resonance at a parallel resonant frequency fp-5. The series resonant frequency fs-5 is lower than the parallel resonant frequency fp-5. Furthermore, the center frequency of the passband is higher than the series resonant frequency fs-5 but lower than the parallel resonant frequency fp-1. When the BAR is a series coupled BAR (e.g. the BAR AR(E) shown in FIG. 2 and in FIG. 3) within the acoustic wave filter (e.g., any one of the acoustic wave filters AWF(1)-AWF(X) within the acoustic wave filtering structure 24 shown in FIG. 1), the BAR is configured to define a pole within the passband of the acoustic wave filter at the series resonant frequency fs-5. Also, when the BAR is the series coupled BAR, the BAR is configured to define a zero within the high edge stopband at the parallel resonant frequency fp-5. In contrast, when the BAR is a shunt coupled BAR (e.g. the BAR AR(H) shown in FIG. 2 and in FIG. 3) within the acoustic wave filter (e.g., any one of the acoustic wave filters AWF(1)-AWF(X) within the acoustic wave filtering structure 24 shown in FIG. 1), the BAR is configured to define a pole within the passband of the acoustic wave filter at the parallel resonant frequency fp-5. Also, when the BAR is the shunt coupled BAR, the BAR is configured to define a zero within the low edge stopband at the series resonant frequency fs-5.

Note that the series resonant frequency fs-1 is lower than the series resonant frequency fs-2. The series resonant frequency fs-2 is lower than the series resonant frequency fs-3. The series resonant frequency fs-3 is lower than the series resonant frequency fs-4. Finally, the series resonant frequency fs-4 is lower than the series resonant frequency fs-5. With regard to the parallel resonant frequencies fp, the parallel resonant frequency fp-1 is lower than the parallel resonant frequency fp-2. The parallel resonant frequency fp-2 is lower than the parallel resonant frequency fp-3. The parallel resonant frequency fp-3 is lower than the parallel resonant frequency fp-4. Finally, the parallel resonant frequency fp-4 is lower than the parallel resonant frequency fp-5.

Accordingly, the impedance curves 182 shift to lower frequencies as the bias from the top electrode and the bottom electrode of the BAR is changed in the negative direction. Thus, the impedance minima I and the impedance maxima A of the BAR are shifted to lower frequencies as the bias from the top electrode and the bottom electrode of the BAR is changed in the negative direction. As a result, as the bias is changed in the negative direction, the passband and stopbands defined by the acoustic wave filter are shifted to lower frequencies. The impedance curves 182 shift to higher frequencies as the bias from the top electrode and the bottom electrode of the BAR is changed in the positive direction. Thus, the impedance minima I and the impedance maxima A of the BAR are shifted to higher frequencies as the bias from the top electrode and the bottom electrode of the BAR is changed in the negative direction. As a result, as the bias is changed in the positive direction, the passband and stopbands defined by the acoustic wave filter are shifted to higher frequencies.

Referring now to FIG. 1, FIG. 5, and FIG. 6, FIGS. 5 and 6 illustrate one embodiment of a transfer function (referred to generically or generally as transfer function 184 and specifically as the transfer function 184-1, 184-2, 184-3) of any one of the acoustic wave filters AWF shown in FIG. 1, where the shunt coupled and the series coupled acoustic wave resonators AR in the acoustic wave filter AWF are each provided as BAR with the topology of the BAR AR(E), BAR AR(H) described above in FIG. 2 and FIG. 3. The transfer function 184 is shifted by a frequency displacement FDL to lower frequencies during a wide band operation in FIG. 5. In FIG. 6, the transfer function 184 is shifted by a frequency displacement FDH to lower frequencies during a wide band operation. More specifically, the transfer function 184-1 in both FIG. 5 and FIG. 6 is the transfer function 184 before the transfer function 184 has been shifted by the frequency displacement FDL, FDH. In FIG. 5, the transfer function 184-2 is the transfer function 184 after the transfer function 184 has been shifted by the frequency displacement FDL to a lower frequency range. The transfer function 184-3 shown in FIG. 6 is the transfer function 184 after the transfer function 184 has been shifted by the frequency displacement FDH to a higher frequency range. The acoustic wave filter AWF is configured to provide the transfer function 184 between the terminus TU and the terminus TX of the acoustic wave filter ACW.

The transfer function 184 defines a passband (referred to generically or generally as passband 188 and specifically as the passband 188-1, 188-2, 188-3), a low frequency edge stopband (referred to generically or generally as low frequency edge stopband 190 and specifically as the low frequency edge stopband 190-1, 190-2, 190-3) and a high frequency edge stopband (referred to generically or generally as high frequency edge stopband 192 and specifically as the high frequency edge stopband 192-1, 192-2, 192-3).

The passband 188 of the transfer function 184 is identified as the portion of the transfer function 184 that allow RF signals to pass when the RF signals are in the frequency range of the passband 188. The passband 188 is shaped by the resonant characteristics of the acoustic wave filter AWF so that RF signals within the frequency range of the passband 188 propagate through the acoustic wave filter AWF. A bandwidth of the passband 188 may be defined as three dB points in the transfer function 184 lower than a maximum of the passband 188 or an average magnitude of the local maxima within the passband 188. A center frequency (referred to generally or generically as center frequencies PC and specifically as center frequencies PC-1 PC-2, PC-3) of the passband 188 is defined as the location of the passband 188 at the midpoint of the three dB points. At frequencies within the passband 188, the passband 188 is determined by the series resonance of series coupled acoustic wave resonators AR in the acoustic wave filter AWF and by the parallel resonance of shunt coupled acoustic wave resonators AR in the acoustic wave filter AWF. A low frequency edge (referred to generally or generically as low frequency edges LE and specifically as low frequency edges LE-1, LE-2, LE-3) of the passband 188 is defined as the three dB point of the passband 188 at the lower frequency. A high frequency edge (referred to generally or generically as high frequency edges HE and specifically as high frequency edges HE-1, HE-2, HE-3) of the passband 188 is defined as the three dB point of the passband 188 at the higher frequency.

The low frequency edge stopband 190 of the transfer function 184 is identified as the portion of the transfer function 184 that blocks RF signals and is provided by roll off from the passband 188 at the low frequency edge LE. Therefore, the low frequency edge stopband 190 is adjacent to the passband 188. RF signals in the frequency range of the low frequency edge stopband 190 are blocked, and thus the low frequency edge stopband 190 increases out-of-band rejection adjacent to the passband 188. The low frequency edge stopband 190 is shaped by the resonant characteristics of the acoustic wave filter AWF so that RF signals within the frequency range of the low frequency edge stopband 190 are blocked from propagating through the acoustic wave filter AWF. A bandwidth of the low frequency edge stopband 190 may be defined as three dB points in the transfer function 184 greater than a minimum of the low frequency edge stopband 190 or an average magnitude of the local minima within the low frequency edge stopband 190. A center frequency (referred to generally or generically as center frequencies LC and specifically as center frequencies LC-1 LC-2, LC-3) of the low frequency edge stopband 190 is defined as the location of the low frequency edge stopband 190 at the midpoint of the three dB points. At frequencies within the low frequency edge stopband 190, the low frequency edge stopband 190 is determined by the series resonance of shunt coupled acoustic wave resonators AR in the acoustic wave filter AWF.

The high frequency edge stopband 192 of the transfer function 184 is identified as the portion of the transfer function 184 that blocks RF signals and is provided by roll off from the passband 188 at the high frequency edge HE. Therefore, the high frequency edge stopband 192 is adjacent to the passband 188. RF signals in the frequency range of the high frequency edge stopband 192 are blocked, and thus the high frequency edge stopband 192 increases out-of-band rejection adjacent to the passband 188. The high frequency edge stopband 192 is shaped by the resonant characteristics of the acoustic wave filter AWF so that RF signals within the frequency range of the high frequency edge stopband 192 are blocked from propagating through the acoustic wave filter AWF. A bandwidth of the high frequency edge stopband 192 may be defined as three dB points in the transfer function 184 greater than a minimum of the high frequency edge stopband 192 or an average magnitude of the local minima within the high frequency edge stopband 192. A center frequency (referred to generally or generically as center frequencies HC and specifically as center frequencies HC-1 HC-2, HC-3) of the high frequency edge stopband 192 is defined as the location of the high frequency edge stopband 192 at the midpoint of the three dB points. At frequencies within the high frequency edge stopband 192, the high frequency edge stopband 192 is determined by the parallel resonance of series coupled acoustic wave resonators AR in the acoustic wave filter AWF.

With regard to the transfer function 184-1, the transfer function 184-1 shown in FIG. 5 and FIG. 6 is the transfer function 184 before it has been shifted by the frequency displacement FDL, FDH. The transfer function 184-1 defines a passband 188-1, which is the passband 188 before the passband 188 is shifted by the frequency displacement FDL, FDH. The passband 188-1 has a center frequency PC-1, a low frequency edge LE-1, and a high frequency edge HE-1. The transfer function 184-1 defines a low frequency edge stopband 190-1, which is the low frequency edge stopband 190 before the low frequency edge stopband 190 is shifted by the frequency displacement FDL, FDH. The low frequency edge stopband 190-1 has a center frequency LC-1 and is defined by roll-off from the passband 188 at the low frequency edge LE-1. The transfer function 184-1 defines a high frequency edge stopband 192-1, which is the high frequency edge stopband 192 before the high frequency edge stopband 192 is shifted by the frequency displacement FDL, FDH. The high frequency edge stopband 192-1 has a center frequency HC-1 and is defined by roll-off from the passband 188 at the high frequency edge HE-1.

Referring again to FIG. 1, FIG. 5, and FIG. 6, FIG. 5 and FIG. 6 illustrate a selected communication band 194 of operation. As shown in FIGS. 5 and 6, the selected communication band 194 has various operating channels (referred to generically or generally as operating channels 196 and specifically as operating channels 196-1, 196-2, 196-3). The passband 188 is provided for wide band operation and thus has a bandwidth greater than the frequency range of the selected communication band 194. In FIG. 5 and FIG. 6, the passband 188-1 is provided so as to include all of the operating channels 196 within the selected communication band 194. Furthermore, the passband 188-1 is positioned so that the center frequency PC-1 of the passband 188-1 is provided within the operating channel 196-1, which is provided close to the center of the selected communication band 194.

As mentioned above in FIG. 1, the dedicated bias control circuitry 36 shown in FIG. 1 is operable to receive the tuning control input 30 that may indicate a selected operating channel 196 among the plurality of operating channels 196 defined by the selected communication band 194. During a wideband mode, the dedicated control circuitry 36 is configured to determine when the selected operating channel 196 indicated by the tuning control input 30 is within the passband 188 but also within the roll off of the passband 188 to the low frequency edge LE or to the high frequency edge HE. When the tuning control input 30 indicates the selected operating channel 196-1 of the selected communication channel 194, the dedicated control circuitry 36 generates the bias control output 44 for the acoustic wave filter ACW so that no shift is provided to the passband 188-1. This is because the selected operating channel 196-1 is well within the passband 188-1 and not within the roll off of the passband 188 to the low frequency edge LE or to the high frequency edge HE. The filter bias voltage generation circuitry 38 therefore does not adjust the bias voltages VB that are applied to the acoustic wave filter ACW that provides the passband 188-1.

With regard to FIG. 5, FIG. 5 illustrates that the transfer function 184-2, which is the transfer function 184 after the transfer function 184-1 has been shifted in response to the tuning control input 30 indicating the selected operating channel 196-2 of the selected communication band 194. As shown in FIG. 5, the selected operating channel 196-2 is within the roll off of the passband 188-1 to the low frequency edge LE-1 before the shift. As such, the dedicated bias control circuitry 36 is configured to identify that the selected operating channel 196-2 is within the roll off of the passband 188-1 to the low frequency edge LE-1. The dedicated bias control circuitry 36 thus generates the bias control output 44 for the acoustic wave filter ACW so that the transfer function 184-1 is shifted by the frequency displacement FDL. The filter bias voltage generation circuitry 38 is configured to adjust the bias voltages VB for the acoustic wave filter AWF so that to provide the shift.

More specifically, the transfer function 184 is provided as the transfer function 184-2 after the filter bias voltage generation circuitry 38 is configured to adjust the bias voltages VB to provide the shift by the frequency displacement FDL. With regard to the transfer function 184-2, the transfer function 184-2 shown in FIG. 5 defines a passband 188-2, which is the passband 188 after the passband 188 is shifted by the frequency displacement FDL. The passband 188-2 has a center frequency PC-2, a low frequency edge LE-2, and a high frequency edge HE-2, all of which have been shifted by the frequency displacement FDL. The transfer function 184-2 defines a low frequency edge stopband 190-2, which is the low frequency edge stopband 190 after the low frequency edge stopband 190 is shifted by the frequency displacement FDL. The low frequency edge stopband 190-2 has a center frequency LC-2 and is defined by roll-off from the passband 188-2 at the low frequency edge LE-2. The transfer function 184-2 defines a high frequency edge stopband 192-2, which is the high frequency edge stopband 192 after the high frequency edge stopband 192 is shifted by the frequency displacement FDL. The high frequency edge stopband 192-2 has a center frequency HC-2 and is defined by roll-off from the passband 188 at the high frequency edge HE-2. The acoustic wave tuning control circuitry 26 is thus configured to adjust the bias voltages VB for the acoustic wave filter AWF so that the selected operating channel 196-2 is closer to the center frequency PC-2 of the passband 188-2 but outside the roll off of the passband 188-2 to the low frequency edge LE-2. In this manner, RF signals operating within the selected operation channel experience less insertion loss by avoiding degradation due to the roll off of the passband 188.

With regard to FIG. 6, FIG. 6 illustrates that the transfer function 184-3, which is the transfer function 184 after the transfer function 184-1 has been shifted in response to the tuning control input 30 indicating the selected operating channel 196-3 of the selected communication band 194. As shown in FIG. 6, the selected operating channel 196-3 is within the roll off of the passband 188-1 to the high frequency edge HE-1 before the shift. As such, the dedicated bias control circuitry 36 is configured to identify that the selected operating channel 196-3 is within the roll off of the passband 188-1 to the high frequency edge HE-1. The dedicated bias control circuitry 36 thus generates the bias control output 44 for the acoustic wave filter ACW so that the transfer function 184-1 is shifted by the frequency displacement FDH. The filter bias voltage generation circuitry 38 is configured to adjust the bias voltages VB for the acoustic wave filter AWF so that to provide the shift.

More specifically, the transfer function 184 is provided as the transfer function 184-3 after the filter bias voltage generation circuitry 38 is configured to adjust the bias voltages VB to provide the shift by the frequency displacement FDH. With regard to the transfer function 184-3, the transfer function 184-3 shown in FIG. 6 defines a passband 188-3, which is the passband 188 after the passband 188 is shifted by the frequency displacement FDH. The passband 188-3 has a center frequency PC-3, a low frequency edge LE-3, and a high frequency edge HE-3 all of which have been shifted by the frequency displacement FDH. The transfer function 184-3 defines a low frequency edge stopband 190-3, which is the low frequency edge stopband 190 after the low frequency edge stopband 190 is shifted by the frequency displacement FDH. The low frequency edge stopband 190-3 has a center frequency LC-3 and is defined by roll-off from the passband 188-3 at the low frequency edge LE-3. The transfer function 184-3 defines a high frequency edge stopband 192-3, which is the high frequency edge stopband 192 after the high frequency edge stopband 192 is shifted by the frequency displacement FDH. The high frequency edge stopband 192-3 has a center frequency HC-3 and is defined by roll-off from the passband 188 at the high frequency edge HE-3. The acoustic wave tuning control circuitry 26 is thus configured to adjust the bias voltages VB for the acoustic wave filter AWF so that the selected operating channel 196-3 is closer to the center frequency PC-3 of the passband 188-3 but outside the roll off of the passband 188-3 to the high frequency edge HE-3. In this manner, RF signals operating within the selected operation channel experience less insertion loss by avoiding degradation due to the roll off of the passband 188.

FIG. 7 illustrates an exemplary acoustic wave filtering system 10-1, which is an embodiment of the acoustic wave filtering system 10 shown in FIG. 1. The acoustic wave filtering system 10-1 includes an acoustic wave filtering structure 24-1 and acoustic wave tuning control circuitry 26-1. In this embodiment, the acoustic wave filtering structure 24-1 shown in FIG. 7 is provided by the acoustic wave filter AWF-1 and does not include any other acoustic wave filters. The acoustic wave tuning control circuitry 26-1 is one embodiment of the exemplary acoustic wave tuning control circuitry 26 shown in FIG. 1. The acoustic wave tuning control circuitry 26-1 includes the dedicated bias control circuitry 36 described above. However, in this embodiment, the acoustic wave tuning control circuitry 26-1 does not include the multi-level DC voltage output(s) 50 shown in FIG. 1. Furthermore, the acoustic wave tuning control circuitry 26-1 only has the DC to DC converter 46(1) that generates the DC control voltage VDC(1). Additionally, the acoustic wave tuning control circuitry 26-1 shown in FIG. 1 includes a bias voltage distribution network 48-1, which is one embodiment of the bias voltage distribution network 48 shown in FIG. 1.

With regard to the acoustic wave filter AWF-1, the acoustic wave filter AWF-1 is a single ended acoustic wave filter. As such, the terminus TU1 and the terminus TD1 are each provided simply as terminals. The acoustic wave filter AWF-1 includes by plurality of series branches E-TU, E-A, E-B, E-C, E-D, E-TD (referred to generally or generically as series branches E) and a plurality of shunt branches H-A1, H-A2, H-B1, H-B2 (referred to generally or generically as shunt branches H). The acoustic wave filter also includes a plurality of series coupled acoustic wave resonators, which in the example are each series coupled BARs (referred to generally or generically as series coupled BARs AR(E) and specifically as series coupled BARs AR(E)-A1, AR(E)-A2, AR(E)-B1, AR(E)-B2, AR(E)-C1, AR(E)-C2, AR(E)-D1, AR(E)-D2)). Each of the series coupled BARs AR(E) may be provided in the same manner as either of the series coupled BARs AR(E) shown in FIG. 2 and FIG. 3. Additionally, the acoustic wave filter includes a plurality of shunt coupled acoustic wave resonators, which in the example are each shunt coupled BARs (referred to generally or generically as shunt coupled BARs AR(H) and specifically as shunt coupled BARs AR(H)-A1, AR(H)-A2, AR(H)-B1, AR(H)-B2). Each of the shunt coupled BARs AR(H) may be provided in the same manner as either of the shunt coupled BARs AR(H) shown in FIG. 2 and FIG. 3.

The acoustic wave filter AWF-1 includes a capacitive element C-TU and an inductor I-TU within a series branch E-TU. The series branch E-TU is connected in series between the terminus TU1 (which in this example is a terminal) and a node NO-1. The capacitive element C-TU and the inductor I-TU are each connected in series within the series branch E-TU such that the capacitive element C-TU is connected between the terminus TU1 and the inductor I-TU and the inductor I-TU is connected between the capacitive element C-TU and the node NO-1. The capacitive element C-TU is provided to provide matching and to block bias voltages generated by the acoustic wave tuning control circuitry 26-1 from entering the upstream RF circuitry 20 (shown in FIG. 1). The inductor I-TU provides an inductive reactance that helps to define a passband of the acoustic wave filter AWF-1. Other types of input and output matching networks can be used in alternative embodiments.

A series branch E-A is connected in series between the node NO-1 and a node NO-2. The acoustic wave filter AWF-1 includes a series coupled BAR AR(E)-A1 and a series coupled BAR AR(E)-A2 within the series branch E-A. More specifically, the series coupled BAR AR(E)-A1 and the series coupled BAR AR(E)-A2 are each connected in series with each other within the series branch E-A. The series coupled BAR AR(E)-A1 is connected between the node NO-1 and the series coupled BAR AR(E)-A2 while the series coupled BAR AR(E)-A2 is connected between the series coupled BAR AR(E)-A1 and the node NO-2.

A series branch E-B is connected in series between the node NO-2 and a node NO-3. The acoustic wave filter AWF-1 includes a series coupled BAR AR(E)-B1 and a series coupled BAR AR(E)-B2 within the series branch E-B. More specifically, the series coupled BAR AR(E)-B1 and the series coupled BAR AR(E)-B2 are each connected in series with each other within the series branch E-B. The series coupled BAR AR(E)-B1 is connected between the node NO-2 and the series coupled BAR AR(E)-B2 while the series coupled BAR AR(E)-B2 is connected between the series coupled BAR AR(E)-B1 and the node NO-3.

A series branch E-C is connected in series between the node NO-3 and a node NO-4. The acoustic wave filter AWF-1 includes a series coupled coupled BAR AR(E)-C1 and a series coupled BAR AR(E)-C2 within the series branch E-C. More specifically, the series coupled BAR AR(E)-C1 and the series coupled BAR AR(E)-C2 are each connected in series with each other within the series branch E-C. The series coupled BAR AR(E)-C1 is connected between the node NO-3 and the series coupled BAR AR(E)-C2 while the series coupled BAR AR(E)-C2 is connected between the series coupled BAR AR(E)-C1 and the node NO-4.

A series branch E-D is connected in series between the node NO-4 and a node NO-5. The acoustic wave filter AWF-1 includes a series coupled BAR AR(E)-D1 and a series coupled BAR AR(E)-D2 within the series branch E-D. More specifically, the series coupled BAR AR(E)-D1 and the series coupled BAR AR(E)-D2 are each connected in series with each other within the series branch E-D. The series coupled BAR AR(E)-D1 is connected between the node NO-4 and the series coupled BAR AR(E)-D2 while the series coupled BAR AR(E)-D2 is connected between the series coupled BAR AR(E)-D1 and the node NO-5.

Finally, a series branch E-TD is connected in series between the node NO-5 and the terminus TD1 (which in this example is a terminal). The acoustic wave filter AWF-1 includes a capacitive element C-TD within the series branch E-TD. More specifically, the capacitive element C-TD is in series between the node NO-5 and the terminus TD1. The capacitive element C-TD provides matching and to block bias voltages generated by the acoustic wave tuning control circuitry 26-1 from entering the downstream RF circuitry 22 (shown in FIG. 1).

As such the series branches E are all connected in series between to form a main signal path of the acoustic wave filter AWF-1 between the terminus TU1 and the terminus TD1. Furthermore each of the series branches E-A, E-B, E-C, E-D (referred to collectively as E-AR) include a pair of series coupled BARs (where the pair of series coupled BARs (AR(E)-A1, AR(E)-A2)), the pair of series coupled BARs (AR(E)-B1, AR(E)-B2)), the pair of series coupled BARs (AR(E)-C1, AR(E)-C2)), and the pair of series coupled BARs (AR(E)-D1, AR(E)-D2)) are referred to generally or generically as pairs of series coupled BARs (AR(E)-1, AR(E)-2)).

The shunt branches H are each connected in shunt with respect to the main signal path created by the series branches E. A shunt branch H-A1 is connected in shunt from the node NO-2 to ground. The shunt branch H-A1 is formed by a shunt sub branch S-A1 connected between the node NO-2 and a node NO-AH and a shunt sub branch S-AM connected between the node NO-AH and ground. The acoustic wave filter AWF-1 includes a shunt coupled BAR AR(H)-A1 and an inductor I-A1 connected in series within the shunt sub branch H-A1. More specifically, the shunt coupled BAR AR(H)-A1 is connected between the node NO-2 and the inductor I-A1 while the inductor I-A1 is connected between the shunt coupled BAR AR(H)-A1 and the node NO-AH. The acoustic wave filter AWF-1 also includes an inductor I-AM connected is series within the shunt sub branch S-AM. Thus, the inductor I-AM is connected between the node NO-AH and ground.

A shunt branch H-A2 is connected in shunt from the node NO-3 to ground. The shunt branch H-A2 is formed by a shunt sub branch S-A2 connected between the node NO-3 and the node NO-AH and the shunt sub branch S-AM connected between the node NO-AH and ground. The acoustic wave filter AWF-1 includes a shunt coupled BAR AR(H)-A2 and an inductor I-A2 connected in series within the shunt sub branch H-A2. More specifically, the shunt coupled BAR AR(H)-A2 is connected between the node NO-3 and the inductor I-A2 while the inductor I-A2 is connected between the shunt coupled BAR AR(H)-A2 and the node NO-AH.

The inductor I-AM will provide a series reactive impedance to both the shunt coupled BAR AR(H)-A1 and the shunt coupled BAR AR(H)-A2 and thus will result in a series resonance of the shunt coupled BAR AR(H)-A1 and a series resonance of the shunt coupled BAR AR(H)-A2 to be moved toward lower frequencies but won't affect the parallel resonances of either. The inductor I-A1 will also provide a series inductive resonance for the shunt coupled BAR AR(H)-A1 but will provide a parallel inductive resonance to the shunt coupled BAR AR(H)-A2. Thus, the inductor I-A1 will move the series resonance of the shunt coupled BAR AR(H)-A1 to lower frequencies while moving the parallel resonance of the shunt coupled BAR AR(H)-A2 to higher frequencies. The inductor I-A2 will also provide a series inductive resonance for the shunt coupled BAR AR(H)-A2 but will provide a parallel inductive resonance to the shunt coupled BAR AR(H)-A1. Thus, the inductor I-A2 will move the series resonance of the shunt coupled BAR AR(H)-A2 to lower frequencies while moving the parallel resonance of the shunt coupled BAR AR(H)-A1 to higher frequencies. In this manner, the inductors I-AM, I-A1, and I-A2 helps set the passband of the acoustic wave filter ACF-1. Other network topologies may have inductors in alternate configurations depending on the desired transfer function characteristics of a design.

A shunt branch H-B1 is connected in shunt from the node NO-4 and to ground. The shunt branch H-B1 is formed by a shunt sub branch S-B1 connected between the node NO-4 and a node NO-BH and a shunt sub branch S-BM connected between the node NO-BH and ground. The acoustic wave filter AWF-1 includes a shunt coupled BAR AR(H)-B1 connected in series within the shunt sub branch H-B1. More specifically, the shunt coupled BAR AR(H)-B1 is connected between the node NO-4 and the node NO-BH. The acoustic wave filter AWF-1 also includes an inductor I-BM connected is series within the shunt sub branch S-BM. Thus, the inductor I-BM is connected between the node NO-BH and ground.

A shunt branch H-B2 is connected in shunt from the node NO-5 to ground. The shunt branch H-B2 is formed by a shunt sub branch S-B2 connected between the node NO-5 and the node NO-BH and the shunt sub branch S-BM connected between the node NO-BH and ground. The acoustic wave filter AWF-1 includes a shunt coupled BAR AR(H)-B2 connected in series within the shunt sub branch H-B2. More specifically, the shunt coupled BAR AR(H)-B2 is connected between the node NO-5 and the node NO-BH.

The inductor I-BM will provide a series reactive impedance to both the shunt coupled BAR AR(H)-B1 and the shunt coupled BAR AR(H)-B2 and thus will result in a series resonance of the shunt coupled BAR AR(H)-B1 and a series resonance of the shunt coupled BAR AR(H)-B2 to be moved toward lower frequencies but won't affect the parallel resonances of either. In this manner, the inductor I-BM helps set the passband of the acoustic wave filter ACF-1.

As a result of the series coupled BARs AR(E), the shunt coupled BARs AR(H), and the inductors I-TU, I-AM, I-BM, I-A1, I-A2, I-B1, I-B2, the acoustic wave filter AWF-1 is configured to provide a transfer function that defines a passband (e.g., such as the passband 188 shown in FIGS. 5 and 6), a low edge stopband (e.g., such as the low edge passband 190 shown in FIGS. 5 and 6), and a high edge pass band (e.g., such as the high edge passband 192 shown in FIGS. 5 and 6). To shift the passband, the acoustic wave tuning control circuitry 26 includes the dedicated bias control circuitry 36 and the filter bias voltage generation circuitry 48-1. As described above, the dedicated bias control circuitry 36 is operable to receive the tuning control input 30, which may indicate a selected communication band and/or a selected channel of operation within the selected communication band. The dedicated bias control circuitry 36 is configured to adjust the bias control output 44(1) so that bias voltages generated by the filter bias voltage generation circuitry 38 are adjusted and thereby shift the passband of the acoustic wave filter AWF-1, as described above.

The filter bias voltage generation circuitry 38-1 includes the DC to DC converter 46(1). The DC to DC converter 46(1) is operable to receive the supply voltage VS and the bias control output 44(1) from the dedicated bias control circuitry 36. The DC to DC converter 46(1) is configured to generate the DC control voltage VDC(1) from the supply voltage VS and adjust the DC control voltage VDC(1) in accordance with the bias control output 44(1). Thus, the DC to DC converter 46(1) provides the DC control voltage VDC(1) with a DC voltage level that is varied as a function of the bias control output 44(1).

In this embodiment, the bias voltage distribution network 48-1 includes a plurality of resistive paths (referred to generically as resistive paths 200 and specifically as resistive paths 200-1, 200-2, 200-3, 200-4, 200-5). In this embodiment, each of the resistive paths 200 has approximately the same resistance RA, which should be greater than approximately 100 kohms and thereby prevent the bias voltage distribution network 48-1 from creating significant insertion losses within the passband of the acoustic wave filter AWF-1. Furthermore, each of the resistive paths 200 has is connected to the DC to DC converter 46(1) so as to receive the DC control voltage VDC(1).

More specifically, a resistive path 200-1 is operable to receive the DC control voltage VDC(1) from the DC to DC converter 46(1). The resistive path 200-1 is configured to produce a bias voltage VB-1 from the VDC(1). The resistive path 200-1 is connected to the node NO-A of the acoustic wave filter AWF-1. Accordingly, the resistive path 200-1 is configured to apply the bias voltage VB-1 at the node NO-A. A resistive path 200-2 is operable to receive the DC control voltage VDC(1) from the DC to DC converter 46(1). The resistive path 200-2 is configured to produce a bias voltage VB-2 from the VDC(1). The resistive path 200-2 is connected to the node NO-B of the acoustic wave filter AWF-1. Accordingly, the resistive path 200-2 is configured to apply the bias voltage VB-2 at the node NO-B. A resistive path 200-3 is operable to receive the DC control voltage VDC(1) from the DC to DC converter 46(1). The resistive path 200-3 is configured to produce a bias voltage VB-3 from the VDC(1). The resistive path 200-3 is connected to the node NO-C of the acoustic wave filter AWF-1. Accordingly, the resistive path 200-3 is configured to apply the bias voltage VB-3 at the node NO-C. A resistive path 200-4 is operable to receive the DC control voltage VDC(1) from the DC to DC converter 46(1). The resistive path 200-4 is configured to produce a bias voltage VB-4 from the VDC(1). The resistive path 200-4 is connected to the node NO-D of the acoustic wave filter AWF-1. Accordingly, the resistive path 200-4 is configured to apply the bias voltage VB-4 at the node NO-D. A resistive path 200-5 is operable to receive the DC control voltage VDC(1) from the DC to DC converter 46(1). The resistive path 200-5 is configured to produce a bias voltage VB-5 from the VDC(1). The resistive path 200-5 is connected to the node NO-5 of the acoustic wave filter AWF-1. Accordingly, the resistive path 200-5 is configured to apply the bias voltage VB-5 at the node NO-5.

Note however that each of the resistive paths 200 has the same resistive value RA, and each of the resistive paths 200 receives the same DC control voltage VDC(1). Accordingly, the bias voltage levels of the bias voltages VB-1, VB-2, VB-3, VB-4, VB-5 are each approximately equal. Thus, the bias voltages VB-1, VB-2, VB-3, VB-4, VB-5 at the nodes NO-1, NO-2, NO-3, NO-4, NO-5 at the ends of the series branches E-AR are at approximately the same voltage level, and thus the bias voltages VB-1, VB-2, VB-3, VB-4, VB-5 cancel across each of the series branches E-AR. As a result, each of the pairs of series coupled BARs (AR(E)-1, AR(E)-2) within each of the series branches E-AR are not biased by the bias voltages VB-1, VB-2, VB-3, VB-4, VB-5. Instead, the shunt coupled BARs AR(H) are biased by the bias voltages VB-2, VB-3, VB-4, VB-5, respectively, since the shunt coupled BARs AR(H) are connected between the nodes NO-2, NO-3, NO-4, NO-5, respectively. Accordingly, the bias voltage distribution network 48-1 is configured to such that the only BARs AR(E), AR(H) within the acoustic wave filter AWF-1 that are biased by the VB-1, VB-2, VB-3, VB-4, VB-5 are the shunt coupled BARs AR(H). Thus, only the shunt coupled BARs AR(H) are used by the acoustic wave tuning control circuitry 26-1 to shift the passband of the acoustic wave filter AWF-1.

FIG. 8 illustrates an exemplary acoustic wave filtering system 10-2, which is an embodiment of the acoustic wave filtering system 10 shown in FIG. 1. The acoustic wave filtering system 10-2 includes the acoustic wave filtering structure 24-1 and acoustic wave tuning control circuitry 26-2. The acoustic wave filtering structure 24-1 of the acoustic wave filtering system 10-2 in FIG. 8 is the same and described above with respect to FIG. 7 and thus includes the acoustic wave filter AWF-1 described above. The acoustic wave tuning control circuitry 26-2 is one embodiment of the exemplary acoustic wave tuning control circuitry 26-2 shown in FIG. 1. Furthermore, the acoustic wave tuning control circuitry 26-2 is the same as the acoustic wave tuning control circuitry 26-2 shown in FIG. 7 except that the acoustic wave tuning control circuitry 26-2 shown in FIG. 8 has a bias voltage distribution network 48-2, which is another embodiment of the bias voltage distribution network 48 shown in FIG. 1.

In this embodiment, the bias voltage distribution network 48-2 includes a plurality of resistive paths (referred to generically as resistive paths 200-L and specifically as resistive paths 200-1, 200-2, 200-33, 200-4) and a plurality of resistive paths (referred to generically as resistive paths 202 and specifically as resistive paths 202-A, 202-B, 202-C, 202-D, 202-E). In this embodiment, each of the resistive paths 200-L and each of the resistive paths 202 has approximately the same resistance RA, which should be greater than approximately 100 kohms and thereby prevent the bias voltage distribution network 48-2 from creating significant insertion losses within the passband of the acoustic wave filter AWF-1. Furthermore, each of the resistive paths 200-L is connected to the DC to DC converter 46 so as to receive the DC control voltage VDC(1), while each of the resistive paths 202 is connected in shunt with respect to the acoustic wave filter AWF-1.

More specifically, a resistive path 200-1 is operable to receive the DC control voltage VDC(1) from the DC to DC converter 46(1). The resistive path 200-1 is configured to produce a bias voltage VB-A from the VDC(1). The resistive path 200-1 is connected to a node NO-A of the acoustic wave filter AWF-1. The node NO-A is provided in the series branch E-A between the pair of series coupled BARs AR(E)-A1, AR(E)-A2. Accordingly, the resistive path 200-1 is configured to apply the bias voltage VB-A at the node NO-A between the pair of series coupled BARs AR(E)-A1, AR(E)-A2. A resistive path 200-2 is operable to receive the DC control voltage VDC(1) from the DC to DC converter 46(1). The resistive path 200-2 is configured to produce a bias voltage VB-B from the VDC(1). The resistive path 200-2 is connected to a node NO-B of the acoustic wave filter AWF-1. The node NO-B is provided in the series branch E-B between the pair of series coupled BARs AR(E)-B1, AR(E)-B2. Accordingly, the resistive path 200-2 is configured to apply the bias voltage VB-B at the node NO-B between the pair of series coupled BARs AR(E)-B1, AR(E)-B2. A resistive path 200-3 is operable to receive the DC control voltage VDC(1) from the DC to DC converter 46(1). The resistive path 200-3 is configured to produce a bias voltage VB-C from the VDC(1). The resistive path 200-3 is connected to a node NO-C of the acoustic wave filter AWF-1. The node NO-C is provided in the series branch E-C between the pair of series coupled BARs AR(E)-C1, AR(E)-C2. Accordingly, the resistive path 200-3 is configured to apply the bias voltage VB-C at the node NO-C between the pair of series coupled BARs AR(E)-C1, AR(E)-C2. A resistive path 200-4 is operable to receive the DC control voltage VDC(1) from the DC to DC converter 46(1). The resistive path 200-4 is configured to produce a bias voltage VB-D from the VDC (1). The resistive path 200-4 is connected to a node NO-D of the acoustic wave filter AWF-1. The node NO-D is provided in the series branch E-D between the pair of series coupled BARs AR(E)-D1, AR(E)-D2. Accordingly, the resistive path 200-4 is configured to apply the bias voltage VB-D at the node NO-D between the pair of series coupled BARs AR(E)-D1, AR(E)-D2.

With regard to the resistive paths 202, a resistive path 202-A is connected in shunt to the node NO-1 of the acoustic wave filter AWF-1. As such, the resistive path 202-A is connected between the node NO-1 and ground. A resistive path 202-B is connected in shunt to the node NO-2 of the acoustic wave filter AWF-1. As such, the resistive path 202-B is connected between the node NO-2 and ground. A resistive path 202-C is connected in shunt to the node NO-3 of the acoustic wave filter AWF-1. As such, the resistive path 202-C is connected between the node NO-3 and ground. A resistive path 202-D is connected in shunt to the node NO-4 of the acoustic wave filter AWF-1. As such, the resistive path 202-D is connected between the node NO-4 and ground. A resistive path 202-E is connected in shunt to the node NO-5 of the acoustic wave filter AWF-1. As such, the resistive path 202-E is connected between the node NO-5 and ground.

Note however that each of the resistive paths 200-L has the same resistive value RA and each of the resistive paths 200-L receives the same DC control voltage VDC(1). Accordingly, the bias voltage levels of the bias voltages VB-A, VB-B, VB-C, VB-D are each approximately equal. Furthermore, each of the resistive paths 202 has the same resistive value RA, and each of the resistive paths 200 is coupled in shunt to ground. Thus, the pairs of series coupled BARs AR(E)-1, AR(E)-2 are biased by the bias voltages VB-A, VB-B, VB-C, VB-D but result in voltage opposition at the nodes NO-2, NO-3, NO-4, NO-5, which are thus not biased. Accordingly, the shunt coupled BARs AR(H) are not biased by the bias voltages VB-A, VB-B, VB-C, VB-D and only the series coupled BARs AR(E) are biased by the bias voltages VB-A, VB-B, VB-C, VB-D. Accordingly, bias voltage distribution network 48-2 is configured so that only the series coupled BARs AR(E) are biased by the bias voltages VB-A, VB-B, VB-C, VB-D.

FIG. 9 illustrates an exemplary acoustic wave filtering system 10-3, which is an embodiment of the acoustic wave filtering system 10 shown in FIG. 1. The acoustic wave filtering system 10-3 includes the acoustic wave filtering structure 24-1 and acoustic wave tuning control circuitry 26-3. The acoustic wave filtering structure 24-1 of the acoustic wave filtering system 10-3 in FIG. 9 is the same as described above with respect to FIG. 7 and thus includes the acoustic wave filter AWF-1 described above. The acoustic wave tuning control circuitry 26-3 is one embodiment of the exemplary acoustic wave tuning control circuitry 26-3 shown in FIG. 1. Furthermore, the acoustic wave tuning control circuitry 26-3 is the same as the acoustic wave tuning control circuitry 26-3 shown in FIG. 7 except that the acoustic wave tuning control circuitry 26-3 shown in FIG. 9 has a bias voltage distribution network 48-3, which is another embodiment of the bias voltage distribution network 48 shown in FIG. 1.

In this embodiment, the bias voltage distribution network 48-3 includes the plurality of resistive paths 200 described above in FIG. 7 and a plurality of resistive paths (referred to generically as resistive paths 202-L and specifically as resistive paths 202-A, 202-B, 202-C, 202-D). More specifically, a resistive path 202-A is connected in shunt to the node NO-A of the acoustic wave filter AWF-X. As such, the resistive path 202-A is connected between the node NO-A and ground. A resistive path 202-B is connected in shunt to the node NO-B of the acoustic wave filter AWF-X. As such, the resistive path 202-B is connected between the node NO-B and ground. A resistive path 202-C is connected in shunt to the node NO-C of the acoustic wave filter AWF-X. As such, the resistive path 202-C is connected between the node NO-C and ground. A resistive path 202-D is connected in shunt to the node NO-D of the acoustic wave filter AWF-X. As such, the resistive path 202-D is connected between the node NO-D and ground.

Thus, the resistive branches 200 each apply a different one of bias voltages VD-1, VD-2, VD-3, VD-4, VD-5 to the nodes NO-1, NO-2, NO-3, NO-4, NO-5 respectively. Each of the pairs of the series coupled BARs AR(E)-1 AR(E)-2 is between a different pair of the resistive branches 200. However, each of the resistive branches 202-L is connected in shunt between the shunt coupled BARs of a different pair of the series coupled BARs AR(E)-1 AR(E)-2. This results in all of the BARs AR(E) being biased by the bias voltages VD-1, VD-2, VD-3, VD-4, VD-5.

FIG. 10 illustrates an exemplary acoustic wave filtering system 10-4, which is an embodiment of the acoustic wave filtering system 10 shown in FIG. 1. The acoustic wave filtering system 10-4 includes an acoustic wave filtering structure 24-2 and acoustic wave tuning control circuitry 26-4. The acoustic wave filtering structure 24-2 of the acoustic wave filtering system 10-4 in FIG. 10 includes only an acoustic wave filter AWF-2. The acoustic wave filter AWF-2 shown in FIG. 10 is the same as the acoustic wave filter AWF-1 described above with respect to FIG. 7, except that the acoustic wave filter AWF-2 has a capacitive element C(H) connected in series with the BAR AR(H)-A1 in the shunt sub branch SA-1. The acoustic wave tuning control circuitry 26-4 is one embodiment of the exemplary acoustic wave tuning control circuitry 26-4 shown in FIG. 1. Furthermore, the acoustic wave tuning control circuitry 26-4 is the same as the acoustic wave tuning control circuitry 26-4 shown in FIG. 7 except that the acoustic wave tuning control circuitry 26-4 shown in FIG. 10 has a bias voltage distribution network 48-4, which is yet another embodiment of the bias voltage distribution network 48 shown in FIG. 1. The bias voltage distribution network 48-4 is the same as the bias voltage distribution network 48-3 shown in FIG. 9 except that the bias voltage distribution network 48-4 further includes a resistive branch 200(H) that connects to the shunt sub branch SA-1 between the capacitive element C(H) and the BAR AR(H)-A1 at node NO(H).

The resistive branch 200(H) is connected to receive the DC control voltage VDC(1) from the DC to DC converter 46(1). The capacitive element C(H) is connected between the node NO-2 and the node NO(H). The resistive branch 200(H) also has a resistance of RA. Thus, the resistive branch 200(H) applies a bias voltage VB(H) at the node NO(H), which biases the BAR AR(H)-A1. The capacitive element C(H) also functions as an AC blocking capacitor. Furthermore, the capacitive element C(H) provides a capacitive series impedance to the BAR AR(H)-A1. As such, the series resonance of the BAR AR(H)-A1 is moved toward higher frequencies. Additionally or alternatively, one or more of the other shunt acoustic resonators AR(H)-A2, AR(H)-B1, AR(H)-B2 may have one or more capacitive elements and resistive branches (which may be identical to the capacitive element C(H) and resistive branches 200(H)) that bias these other the other shunt acoustic resonators AR(H)-A2, AR(H)-B1, AR(H)-B2 in the same manner as the resonator AR(H)-A1 described with respect to FIG. 10.

FIG. 11 illustrates an exemplary acoustic wave filtering system 10-5, which is an embodiment of the acoustic wave filtering system 10 shown in FIG. 1. The acoustic wave filtering system 10-5 includes an acoustic wave filtering structure 24-3 and acoustic wave tuning control circuitry 26-5. The acoustic wave filtering structure 24-3 of the acoustic wave filtering system 10-5 in FIG. 11 includes only an acoustic wave filter AWF-3. The acoustic wave filter AWF-3 shown in FIG. 11 is the same as the acoustic wave filter AWF-1 described above with respect to FIG. 7, except that the acoustic wave filter AWF-3 has a capacitive element C(E) connected in series with the BAR AR(E)-B1 in the series sub branch E-B. The acoustic wave tuning control circuitry 26-5 is one embodiment of the exemplary acoustic wave tuning control circuitry 26-5 shown in FIG. 1. Furthermore, the acoustic wave tuning control circuitry 26-5 is the same as the acoustic wave tuning control circuitry 26-5 shown in FIG. 7 except that the acoustic wave tuning control circuitry 26-5 shown in FIG. 11 has a bias voltage distribution network 48-5, which is yet another embodiment of the bias voltage distribution network 48 shown in FIG. 1. The bias voltage distribution network 48-5 is the same as the bias voltage distribution network 48-3 shown in FIG. 9 except that the bias voltage distribution network 48-5 further includes a resistive branch 200(E) that connects to the series branch E-B between the capacitive element C(E) and the BAR AR(E)-B1.

The resistive branch 200(E) is connected to receive the DC control voltage VDC(1) from the DC to DC converter 46(1). The capacitive element C(E) is connected between the node NO-2 and the node NO(E). The resistive branch 200(E) also has a resistance of RA. Thus, the resistive branch 200(E) applies a bias voltage VB(E) at the node NO(E), which is between the capacitive element C(E) and the BAR AR(E)-B1. The capacitive element C(E) provides a capacitive series impedance to the BAR AR(E)-B1. As such, the series resonance of the BAR AR(E)-B1 is moved toward higher frequencies. Additionally or alternatively, one or more of the other series acoustic resonators AR(E)-A1, AR(E)-A2, AR(E)-B2, AR(E)-C1, AR(E)-C2 may have one or more capacitive elements and resistive branches (which may be identical to the capacitive element C(E) and resistive branches 200(E)) that bias these other the other series acoustic resonators AR(E)-A1, AR(E)-A2, AR(E)-B2, AR(E)-C1, AR(E)-C2 in the same manner as the resonator AR(E)-B1 described with respect to FIG. 11.

FIG. 12 illustrates an exemplary acoustic wave filtering system 10-6, which is an embodiment of the acoustic wave filtering system 10 shown in FIG. 1. The acoustic wave filtering system 10-6 includes an acoustic wave filtering structure 24-4 and acoustic wave tuning control circuitry 26-6. In this embodiment, the acoustic wave filtering structure 24-4 shown in FIG. 12 is provided by the acoustic wave filter AWF-4 and does not include any other acoustic wave filters. The acoustic wave filter AWF-4 shown in FIG. 12 is a differential acoustic wave filter. The acoustic wave tuning control circuitry 26-6 is one embodiment of the exemplary acoustic wave tuning control circuitry 26 shown in FIG. 1. The acoustic wave tuning control circuitry 26-6 includes the dedicated bias control circuitry 36 described above. However, in this embodiment, the acoustic wave tuning control circuitry 26-6 does not include the multi-level DC voltage output(s) 50 shown in FIG. 1. Furthermore, the acoustic wave tuning control circuitry 26-6 only has the DC to DC converter 46(1) that generates the DC control voltage VDC(1). Additionally, the acoustic wave tuning control circuitry 26-6 shown in FIG. 1 includes a bias voltage distribution network 48-6, which is still another embodiment of the bias voltage distribution network 48 shown in FIG. 1.

With regard to the acoustic wave filter AWF-4, the acoustic wave filter AWF-4 is a differential acoustic wave filter. As such, the terminus TU1 is provided by a pair of terminals T-AT, T-AB and the terminus TD1 is provided by a pair of terminals T-BT, T-BB. The acoustic wave filter AWF-4 is in a ladder configuration. The acoustic wave filter AWF-4 includes a plurality of acoustic wave resonators, which in the example are each BARs (referred to generally or generically as BARs AR and specifically as BARs AR-1T, AR-1B, AR-1H, AR-1L, AR-2T, AR-2B, AR-2H, AR-2L).

The BARs AR shown in FIG. 1 are arranged in a ladder configuration. More specifically, the BAR AR-1T is connected between the terminal T-AT and a node N-AT. The BAR AR-1H is connected between the node N-AT and a node N-1S. The BAR AR-1L is connected between the node N-1S and a node N-AB. The BAR AR-1L is connected between the terminal T-AB and the node N-AB. The BAR AR-2T is connected between the terminal T-BT and a node N-BT. The BAR AR-2H is connected between the node N-BT and a node N-2S. The BAR AR-2L is connected between the node N-2S and a node N-BB. The BAR AR-2L is connected between the terminal T-BT and the node N-BB. The node N-AT is directly connected to the node N-BT. Finally, the node N-AB is directly connected to the node N-BB.

As a result of the BARs, the acoustic wave filter AWF-4 is configured to provide a transfer function that defines a passband (e.g., such as the passband 188 shown in FIGS. 5 and 6), a low edge stopband (e.g., such as the low frequency edge passband 190 shown in FIGS. 5 and 6), and a high edge pass band (e.g., such as the high frequency edge passband 192 shown in FIGS. 5 and 6). To shift the passband, the acoustic wave tuning control circuitry 26-6 includes the dedicated bias control circuitry 36 and the filter bias voltage generation circuitry 38-6. As described above, the dedicated bias control circuitry 36 is operable to receive the tuning control input 30, which may indicate a selected communication band and/or a selected channel of operation within the selected communication band. The dedicated bias control circuitry 36 is configured to adjust the bias control output 44(1) so that bias voltages generated by the filter bias voltage generation circuitry 38-4 are adjusted and thereby shift the passband of the acoustic wave filter AWF-4, as described above.

The filter bias voltage generation circuitry 38-6 includes the DC to DC converter 46(1). The DC to DC converter 46(1) is operable to receive the supply voltage VS and the bias control output 44(1) from the dedicated bias control circuitry 36. The DC to DC converter 46(1) is configured to generate the DC control voltage VDC(1) from the supply voltage VS and adjust the DC control voltage VDC(1) in accordance with the bias control output 44(1). Thus, the DC to DC converter 46(1) provides the DC control voltage VDC(1) with a DC voltage level that is varied as a function of the bias control output 44(1).

In this embodiment, the bias voltage distribution network 48-6 includes a plurality of resistive paths (referred to generically as resistive paths 206 and specifically as resistive paths 206-1, 206-2) and passive impedance elements (referred to generally or generically as passive impedance elements PE and specifically as passive impedance elements PE-1T, PE-1S, PE-1B, PE-2T, PE-2S, PE-2B). With regard to the resistive paths 206, each of the resistive paths 206 has approximately the same resistance RA, which should be greater than approximately 100 kohms and thereby prevent the bias voltage distribution network 48-6 from creating significant insertion losses within the passband of the acoustic wave filter AWF-4. Furthermore, each of the resistive paths 206 is connected to the DC to DC converter 46(1) so as to receive the DC control voltage VDC(1). The passive impedance elements PE are configured as bias divider networks, as explained in further detail below. Thus, the passive impedance elements PE may be either resistive elements or capacitive elements.

The resistive path 206-1 is operable to receive the DC control voltage 46(1) and is connected to a node N-1D. The node N-1D is provided between the passive impedance element PE-1T and the passive impedance element PE-1B. The passive impedance element PE-1T and the passive impedance element PE-1B may both be resistive elements having the same resistance or may both be capacitive elements having the same capacitance. The passive impedance element PE-1T is connected from the node N-1D to a node between the node N-AT and the BAR AR-1H. The passive impedance element PE-1B is connected from the node N-1D to a node between the node N-AB and the BAR AR-1L. The passive impedance element PE-1S is connected in shunt at a node N-1S. The node N-1S is between the BAR AR-1H and the BAR AR-1L.

In this manner, the resistive path 206-1 produces a bias voltage from the DC control voltage VDC(1). The bias voltage is applied to the node N-1D. The passive impedance elements PE-1T, PE-1S, PE-1B form a balanced voltage divider. The voltage divider applies half the bias voltage at node N-AT and half the bias voltage at node N-AB. As such, the BAR AR-1T (which is connected to node N-AT), the BAR AR-1B (which is connected to node N-AB), the BAR AR-1H (which is connected between the node N-AT and the node N-1S), and the BAR AR-1B (which is connected between the node N-AT and the node N-1S) are each biased by half the bias voltage. The passive impedance element PE-1S maintains balance between the biases at the node N-AT and at the node N-AB.

The resistive path 206-2 is operable to receive the DC control voltage 46(1) and is connected to a node N-2D. The node N-2D is provided between the passive impedance element PE-2T and the passive impedance element PE-2B. The passive impedance element PE-2T and the passive impedance element PE-2B may both be resistive elements having the same resistance (which is also the same as the resistance of each of the passive impedance elements PE-1T, PE-1B if the passive impedance elements PE-2T, PE-2B are resistive elements) or may both be capacitive elements having the same capacitance (which is also the same as the capacitance of each of the passive impedance elements PE-1T, PE-1B if the passive impedance elements PE-2T, PE-2B are capacitive elements). The passive impedance element PE-2T is connected from the node N-2D to a node between the node N-BT and the BAR AR-2H. The passive impedance element PE-2B is connected from the node N-2D to a node between the node N-BB and the BAR AR-2L. The passive impedance element PE-2S is connected in shunt at a node N-2S. The node N-2S is between the BAR AR-2H and the BAR AR-2L.

In this manner, the resistive path 206-2 produces a bias voltage from the DC control voltage VDC(1). The bias voltage is applied to the node N-2D. The passive impedance elements PE-2T, PE-2S, PE-2B form a balanced voltage divider. The voltage divider applies half the bias voltage at node N-BT and half the bias voltage at node N-BB. As such, the BAR AR-2T (which is connected to node N-BT), the BAR AR-2B (which is connected to node N-BB), the BAR AR-2H (which is connected between the node N-BT and the node N-2S), and the BAR AR-2B (which is connected between the node N-BT and the node N-2S) are each biased by half the bias voltage. The passive impedance element PE-2S maintains balance between the biases at the node N-BT and at the node N-BB.

FIG. 13 illustrates an exemplary acoustic wave filtering system 10-7, which is an embodiment of the acoustic wave filtering system 10 shown in FIG. 1. The acoustic wave filtering system 10-7 includes an acoustic wave filtering structure 24-5 and acoustic wave tuning control circuitry 26-7. In this embodiment, the acoustic wave filtering structure 24-5 shown in FIG. 13 is provided by the acoustic wave filter AWF-5 and does not include any other acoustic wave filters. The acoustic wave filter AWF-5 shown in FIG. 13 is another differential acoustic wave filter. The acoustic wave tuning control circuitry 26-7 is one embodiment of the exemplary acoustic wave tuning control circuitry 26 shown in FIG. 1. The acoustic wave tuning control circuitry 26-7 includes the dedicated bias control circuitry 36 described above. However, in this embodiment, the acoustic wave tuning control circuitry 26-7 does not include the multi-level DC voltage output(s) 50 shown in FIG. 1. Furthermore, the acoustic wave tuning control circuitry 26-7 only has the DC to DC converter 46(1) that generates the DC control voltage VDC(1). Additionally, the acoustic wave tuning control circuitry 26-7 shown in FIG. 1 includes a bias voltage distribution network 48-7, which is one embodiment of the bias voltage distribution network 48 shown in FIG. 1.

With regard to the acoustic wave filter AWF-5, the acoustic wave filter AWF-5 is a differential acoustic wave filter. As such, the terminus TU1 is provided by a pair of terminals T-1T, T-1B and the terminus TD1 is provided by a pair of terminals T-2T, T-2B. The acoustic wave filter AWF-5 is lattice configuration. The acoustic wave filter AWF-5 includes a plurality of acoustic wave resonators, which in the example are each BARs (referred to generally or generically as BARs AR and specifically as BARs AR-AT, AR-Aft AR-AX, AR-1X, AR-BT, AR-BB, AR-2X, AR-BX).

The BARs AR shown in FIG. 13 are arranged in a lattice configuration. The terminal T-1T is connected directly to a node N-1T. The BAR AR-AT is connected between the node N-1T and a node N-2T. The BAR AR-AX is connected between the node N-1T and a node N-AX. The BAR AR-1X (which is optional in this case) is connected between the node N-AX and a node N-2B. The terminal T-1B is connected to a node N-1B.

Furthermore, the terminal T-2T is connected directly to a node N-2T. The BAR AR-BT is connected between the node N-1B and a node N-2B. The BAR AR-BX is connected between the node N-1B and a node N-BX. The BAR AR-2X (which is optional in this case) is connected between the node N-BX and a node N-2T. The terminal T-2B is connected directly to the node N-2B.

As a result of the BARs, the acoustic wave filter AWF-5 is configured to provide a transfer function that defines a passband (e.g., such as the passband 188 shown in FIGS. 5 and 6), a low edge stopband (e.g., such as the low edge frequency passband 190 shown in FIGS. 5 and 6), and a high edge pass band (e.g., such as the high edge frequency passband 192 shown in FIGS. 5 and 6). To shift the passband, the acoustic wave tuning control circuitry 26-7 includes the dedicated bias control circuitry 36 and the filter bias voltage generation circuitry 48-7. As described above, the dedicated bias control circuitry 36 is operable to receive the tuning control input 30, which may indicate a selected communication band and/or a selected channel of operation within the selected communication band. The dedicated bias control circuitry 36 is configured to adjust the bias control output 44(1) so that bias voltages generated by the filter bias voltage generation circuitry 38-7 are adjusted and thereby shift the passband of the acoustic wave filter AWF-5, as described above.

The filter bias voltage generation circuitry 38-7 includes the DC to DC converter 46(1). The DC to DC converter 46(1) is operable to receive the supply voltage VS and the bias control output 44(1) from the dedicated bias control circuitry 36. The DC to DC converter 46(1) is configured to generate the DC control voltage VDC(1) from the supply voltage VS and adjust the DC control voltage VDC(1) in accordance with the bias control output 44(1). Thus, the DC to DC converter 46(1) provides the DC control voltage VDC(1) with a DC voltage level that is varied as a function of the bias control output 44(1).

In this embodiment, the bias voltage distribution network 48-7 includes a plurality of resistive paths (referred to generically as resistive paths 208 and specifically as resistive paths 208-1, 208-2, 208-3, 208-4) and passive impedance elements (referred to generally or generically as passive impedance elements PE and specifically as passive impedance elements PE-AT, PE-AB, PE-BT, PE-BB). With regard to the resistive paths 208, each of the resistive paths 208 has approximately the same resistance RA, which should be greater than approximately 100 kohms and thereby prevent the bias voltage distribution network 48-7 from creating significant insertion losses within the passband of the acoustic wave filter AWF-5. Furthermore, each of the resistive paths 208 is connected to the DC to DC converter 46(1) so as to receive the DC control voltage VDC(1). The passive impedance elements PE are configured as bias divider networks, as explained in further detail below. Thus, the passive impedance elements PE may be either resistive elements or capacitive elements.

The resistive path 208-1 is operable to receive the DC control voltage 46(1) and is connected to a node N-AD. The node N-AD is provided between the passive impedance element PE-AT and the passive impedance element PE-AB. The passive impedance element PE-AT and the passive impedance element PE-AB may both be resistive elements having the same resistance or may both be capacitive elements having the same capacitance. The passive impedance element PE-AT is connected from the node N-AD to the node N-1T. The passive impedance element PE-AB is connected from the node N-AD to the node N-1B.

In this manner, the resistive path 208-1 is operable to receive the DC control voltage VDC(1) and is configured to produce a bias voltage from the DC control voltage VDC(1). The bias voltage is applied to the node N-AD. The passive impedance elements PE-AT, PE-AB form a voltage divider. The voltage divider applies a bias voltage at node N-1T having a magnitude equal to half the bias voltage applied at the node N-AD by the resistive path 208-1 but of opposite polarity. The voltage divider also applies a bias voltage at node N-1B having a magnitude equal to half the bias voltage applied at the node N-AD by the resistive path 208-1 but of opposite polarity.

The resistive path 208-2 is operable to receive the DC control voltage 46(1) and is connected to the node N-BX. The node N-BX is provided between the BAR AR-BX and the BAR AR-2X. The resistive path 208-2 has a resistance equal to the resistance of the resistive path 208-1. Thus, the bias voltage applied by the resistive path 208-2 at the node N-BX is equal in magnitude and of the same polarity as the bias voltage applied by the resistive path 208-1 at the node N-AD.

The resistive path 208-3 is operable to receive the DC control voltage 46(1) and is connected to the node N-AX. The node N-AX is provided between the BAR AR-AX and the BAR AR-1X. The resistive path 208-3 has a resistance equal to the resistance of the resistive path 208-1. Thus, the bias voltage applied by the resistive path 208-3 at the node N-AX is equal in magnitude and of the same polarity as the bias voltage applied by the resistive path 208-1 at the node N-AD.

The resistive path 208-4 is operable to receive the DC control voltage 46(1) and is connected to a node N-BD. The node N-BD is provided between the passive impedance element PE-BT and the passive impedance element PE-BB. The passive impedance element PE-BT and the passive impedance element PE-BB may both be resistive elements having the same resistance or may both be capacitive elements having the same capacitance. The passive impedance element PE-AT and the passive impedance element PE-AB may also both have the same resistance as the passive impedance element PE-BT and the passive impedance element PE-BB if the passive impedance element PE-AT, the passive impedance element PE-Aft the passive impedance element PE-BT, and the passive impedance element PE-BB are all resistive elements. The passive impedance element PE-AT and the passive impedance element PE-AB may also both have the same capacitance as the passive impedance element PE-BT and the passive impedance element PE-BB if the passive impedance element PE-AT, the passive impedance element PE-Aft the passive impedance element PE-BT, and the passive impedance element PE-BB are all capacitive elements. The passive impedance element PE-BT is connected from the node N-BD to the node N-2T. The passive impedance element PE-BB is connected from the node N-BD to the node N-2B.

In this manner, the resistive path 208-4 is operable to receive the DC control voltage VDC(1) and is configured to produce a bias voltage from the DC control voltage VDC(1). The bias voltage is applied to the node N-BD. The passive impedance elements PE-BT, PE-BB form a voltage divider. The voltage divider applies a bias voltage at node N-2T having a magnitude equal to half the bias voltage applied at the node N-BD by the resistive path 208-4 but of opposite polarity. The voltage divider also applies a bias voltage at node N-2B having a magnitude equal to half the bias voltage applied at the node N-BD by the resistive path 208-4 but of opposite polarity.

Note then that the bias voltages applied to the nodes N-AD, N-AX, N-BX, N-BD by the resistive paths 208 are all approximately equal in magnitude and of the same polarity. Furthermore, the bias voltages applied to the nodes N-1T, N-2T, N-1B, N-2B by the passive impedance elements PE are each approximately equal but of the same polarity. However, the bias voltages applied to the nodes N-1T, N-2T, N-1B, N-2B by the passive impedance elements PE are equal to half the magnitude of the bias voltages applied to the nodes N-AD, N-AX, N-BX, N-BX by the resistive paths 208. The bias voltages applied to the nodes N-1T, N-2T, N-1B, N-2B by the passive impedance elements PE are also of opposite polarity as the bias voltages applied to the nodes N-AD, N-AX, N-BX, N-BX by the resistive paths 208. Accordingly, the bias provided by the bias voltage distribution network 38-7 across the each of the BARs AR-AX, AR-BX, AR-1X, AR-2X is equal to about one and a half times the bias voltage applied to each of the nodes N-1T, N-2T, N-1B, N-2B by the bias distribution network. Furthermore, as mentioned above, the bias voltages applied to the nodes N-1T, N-2T, N-1B, N-2B by the passive impedance elements PE are each approximately equal. Thus, the bias distribution network 38-7 does not significantly bias the BARs AR-AT, AR-BT.

Referring now to FIGS. 2, 3, and 7-13, it should be noted that the resistive paths 200, 202, 206, 208 shown in FIGS. 7-13 may each be formed as the thin film resistor 108 shown in FIG. 2 and FIG. 3. In this manner, the resistive paths 200, 202, 206, 208 can be formed in the semiconductor die(s) (such as the semiconductor dies 52, 54) during semiconductor fabrication. In this manner, the control interface between the resistive paths 200, 202, 206, 208 and other circuitry within the acoustic wave tuning control circuitry 26 becomes greatly simplified and no RF nodes are exposed by the resistive paths 200, 202, 206, 208. Furthermore, no line routing would be needed between the resistive paths 200, 202, 206, 208 and the acoustic wave filters AWF.

Those skilled in the art will recognize improvements and modifications to the preferred embodiments of the present disclosure. All such improvements and modifications are considered within the scope of the concepts disclosed herein and the claims that follow.

What is claimed is:

1. An acoustic wave filtering system comprising:
   a first acoustic wave filter that defines a first passband, wherein the first acoustic wave filter comprises a first plurality of acoustic wave resonators that includes a first acoustic wave resonator; and
   an acoustic wave tuning control circuitry including a filter bias voltage generation circuitry operable to receive a bias control output and configured to:
   generate a first plurality of bias voltages;
   apply the first plurality of bias voltages to the first acoustic wave filter; and
   adjust the one or more of the first plurality of bias voltages in accordance with the bias control output so that the first acoustic wave filter shifts the first passband in accordance with the first plurality of bias voltages.

2. The acoustic wave filtering system of claim 1 wherein:
   the first acoustic wave filter is a differential acoustic wave filter; and
   the first plurality of acoustic wave resonators are in a ladder configuration.

3. The acoustic wave filtering system of claim 1 further comprises a second acoustic wave filter defining a second passband wherein:
   the second acoustic wave filter comprises a second plurality of acoustic wave resonators;
   the acoustic wave tuning control circuitry is further configured to:

apply a second plurality of bias voltages to the second acoustic wave filter so as to bias one or more of the second plurality of acoustic wave resonators; and adjust one or more of the second plurality of bias voltages so that the second acoustic wave filter shifts the second passband of the second acoustic wave filter.

4. The acoustic wave filtering system of claim 1 wherein:
the first acoustic wave filter is a differential acoustic wave filter; and
the first plurality of acoustic wave resonators are in a lattice configuration.

5. The acoustic wave filtering system of claim 1 wherein the filter bias voltage generation circuitry comprises:
a DC to DC converter operable to receive a supply voltage and to receive the bias control output, wherein the DC to DC converter is configured to:
generate a first DC control voltage from the supply voltage; and
adjust the first DC control voltage in accordance with the bias control output; and
a bias voltage distribution network operably associated with the DC to DC converter wherein the bias voltage distribution network is configured to:
produce the first plurality of bias voltages in response to the first DC control voltage;
apply the first plurality of bias voltages to the first acoustic wave filter to bias the one or more of the first plurality of acoustic wave resonators; and
adjust the first plurality of bias voltages in accordance with the first DC control voltage.

6. The acoustic wave filtering system of claim 5 wherein the filter bias voltage generation circuitry further comprises a multi-level DC voltage output circuit operable to receive the first DC control voltage and wherein:
the multi-level DC voltage output circuit is configured to produce a plurality of DC control voltages from the first DC control voltage so that the plurality of DC control voltages are a function of the first DC control voltage; and
the bias voltage distribution network is configured to generate the first plurality of bias voltages and adjust the first plurality of bias voltages in accordance with the first DC control voltage by being configured to produce the first plurality of bias voltages from the plurality of DC control voltages so that the first plurality of bias voltages are adjusted as the function of the plurality of DC control voltages.

7. The acoustic wave filtering system of claim 1 wherein the acoustic wave tuning control circuitry further comprises a bias control circuit operable to receive a tuning control input that identifies a selected communication band of operation and wherein:
the bias control circuit is configured to generate the bias control output so that the bias control output is set as a function of the selected communication band identified by the tuning control input wherein the function is provided so that the filter bias voltage generation circuitry adjusts the one or more of the first plurality of bias voltages such that the first passband is shifted into the selected communication band identified by the tuning control input.

8. The acoustic wave filtering system of claim 7 wherein the acoustic wave tuning control circuitry further comprises a temperature sensor to measure a temperature of the first acoustic wave filter and generate a temperature output that indicates the temperature that was measured wherein the bias control circuit is further operable to receive the temperature output and is configured to generate the bias control output so that the bias control output is set as a function of the temperature indicated by the temperature output.

9. The acoustic wave filtering system of claim 1 further comprising a semiconductor die that comprises a semiconductor wafer and a bulk acoustic wave region wherein the bulk acoustic wave region comprises:
a bragg mirror formed over the semiconductor wafer;
a conductive plate formed over the bragg mirror;
a piezoelectric layer provided on the conductive plate;
the first acoustic wave resonator, wherein the first acoustic wave resonator is a first bulk acoustic wave resonator having a first top electrode, a first bottom electrode formed from a first portion of the conductive plate, and a first piezoelectric substrate that is formed between the first top electrode and the first bottom electrode and by a first segment of the piezoelectric layer; and
a second bulk acoustic wave resonator included in the first plurality of acoustic wave resonators wherein the second bulk acoustic wave resonator has a second top electrode, a second bottom electrode formed by a second portion of the conductive plate, and a second piezoelectric substrate that is formed between the second top electrode and the second bottom electrode and by a second segment of the piezoelectric layer.

10. The acoustic wave filtering system of claim 1 further comprising a semiconductor die wherein:
the semiconductor die comprises a semiconductor wafer and an bulk acoustic wave region that comprises:
a bragg mirror formed over the semiconductor wafer;
the first acoustic wave resonator, wherein the first acoustic wave resonator is a first bulk acoustic wave resonator formed over the bragg mirror, wherein the first bulk acoustic wave resonator has a first top electrode, a first bottom electrode, and a first piezoelectric substrate formed between the first top electrode and the first bottom electrode; and
a second bulk acoustic wave resonator included in the first plurality of acoustic wave resonators wherein the second bulk acoustic wave resonator is formed over the first bulk acoustic wave resonator, wherein the second bulk acoustic wave resonator has a second top electrode, a second bottom electrode formed above and connected to the first top electrode, and a second piezoelectric substrate formed between the second top electrode and the second bottom electrode.

11. The acoustic wave filtering system of claim 1 wherein the acoustic wave tuning control circuitry is further operable to receive a tuning control input that indicates a selected operating channel among a plurality of operating channels defined by a selected communication band of operation wherein the acoustic wave tuning control circuitry is configured to:
identify when the selected operating channel is within a roll off of a low frequency edge of the first passband; and
adjust the first plurality of bias voltages so that the first acoustic wave filter shifts the first passband of the first acoustic wave filter to provide the selected operating channel closer to a center frequency of the first passband but outside the roll off of the low frequency edge of the first passband.

12. The acoustic wave filtering system of claim 1 wherein the acoustic wave tuning control circuitry is further operable to receive a tuning control input that indicates a selected operating channel among a plurality of operating channels defined by a selected communication band of operation wherein the acoustic wave tuning control circuitry is configured to:
　　identify when the selected operating channel is within roll off of a high frequency edge of the first passband; and
　　adjust the first plurality of bias voltages so that the first acoustic wave filter shifts the first passband of the first acoustic wave filter to provide the selected operating channel closer to a center frequency of the first passband but outside the roll off of the high frequency edge of the first passband.

13. The acoustic wave filtering system of claim 1 wherein:
　　the first acoustic wave filter is a single ended acoustic wave filter;
　　the acoustic wave tuning control circuitry comprises a bias voltage distribution network configured to apply the first plurality of bias voltages to the single ended acoustic wave filter; and
　　the first plurality of acoustic wave resonators comprises:
　　　　series coupled acoustic wave resonators; and
　　　　shunt coupled acoustic wave resonators.

14. The acoustic wave filtering system of claim 13 wherein the bias voltage distribution network is configured such that the one or more of the first plurality of acoustic wave resonators biased by the first plurality of bias voltages are only the shunt coupled acoustic wave resonators.

15. The acoustic wave filtering system of claim 13 wherein the bias voltage distribution network is configured such that the one or more of the first plurality of acoustic wave resonators biased by the first plurality of bias voltages are only the series coupled acoustic wave resonators.

16. The acoustic wave filtering system of claim 13 wherein:
　　the series coupled acoustic wave resonators comprise pairs of the series coupled acoustic wave resonators wherein the series coupled acoustic wave resonators in each of the pairs of the series coupled acoustic wave resonators are connected in series to one another;
　　a different one of the shunt coupled acoustic wave resonators is connected in shunt between each of the pairs of the series coupled acoustic wave resonators; and
　　the bias voltage distribution network comprises a first set of resistive branches and a second set of resistive branches wherein:
　　　　the first set of resistive branches applies a different one of the first plurality of bias voltages such that each of the pairs of the series coupled acoustic wave resonators is between a different pair of the first set of resistive branches; and
　　　　each of the second set of resistive branches is coupled in shunt and between the series coupled acoustic wave resonators of a different one of the pairs of the series coupled acoustic wave resonators.

17. The acoustic wave filtering system of claim 13 further comprising a capacitive element connected in series with a first one of the shunt coupled acoustic wave resonators wherein the bias voltage distribution network is configured to apply one of the first plurality of bias voltages between the capacitive element and the first one of the shunt coupled acoustic wave resonators.

18. The acoustic wave filtering system of claim 13 further comprising a capacitive element connected in series with a first one of the series coupled acoustic wave resonators wherein the bias voltage distribution network is configured to apply one of the first plurality of bias voltages between the capacitive element and the first one of the series coupled acoustic wave resonators.

* * * * *

UNITED STATES PATENT AND TRADEMARK OFFICE
CERTIFICATE OF CORRECTION

PATENT NO. : 10,205,436 B2
APPLICATION NO. : 15/338544
DATED : February 12, 2019
INVENTOR(S) : Baker Scott et al.

Page 1 of 1

It is certified that error appears in the above-identified patent and that said Letters Patent is hereby corrected as shown below:

In the Specification

In Column 37, Line 54, replace "AR-Aft" with --AR-AB--.

In Column 39, Lines 39 and 46, replace "element PE-Aft" with --element PE-AB--.

Signed and Sealed this
Second Day of April, 2019

Andrei Iancu
*Director of the United States Patent and Trademark Office*